US012772431B2

(12) United States Patent
Guo

(10) Patent No.: US 12,772,431 B2
(45) Date of Patent: Oct. 20, 2026

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei City (CN)

(72) Inventor: Shuai Guo, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 455 days.

(21) Appl. No.: 18/446,514

(22) Filed: Aug. 9, 2023

(65) Prior Publication Data

US 2023/0389271 A1 Nov. 30, 2023

Related U.S. Application Data

(63) Continuation of application No. PCT/CN2022/079804, filed on Mar. 8, 2022.

(30) Foreign Application Priority Data

Jan. 13, 2022 (CN) ......................... 202210038578.0

(51) Int. Cl.
*H10B 12/00* (2023.01)

(52) U.S. Cl.
CPC ........... *H10B 12/05* (2023.02); *H10B 12/315* (2023.02)

(58) Field of Classification Search
CPC .... H10B 12/05; H10B 12/315; H10B 12/488; H10D 30/6728; H10D 30/025
See application file for complete search history.

(56) References Cited

U.S. PATENT DOCUMENTS 6,020,239 A * 2/2000 Gambino ........... H10D 30/6728 438/269
8,753,953 B1 6/2014 Cheng
(Continued)

FOREIGN PATENT DOCUMENTS

CN 101814531 A 8/2010
CN 103094068 A 5/2013
(Continued)

OTHER PUBLICATIONS

International Search Report in the international application No. PCT/CN2022/079804, mailed on Oct. 10, 2022. 2 pages.
(Continued)

*Primary Examiner* — Britt Hanley
*Assistant Examiner* — Kevin Quinto
(74) *Attorney, Agent, or Firm* — Syncoda LLC; Feng Ma

(57) ABSTRACT

Embodiments of the disclosure relate to the semiconductor field, and provide a semiconductor structure and a method for manufacturing the same. The semiconductor structure includes: a substrate that has a bit line extending in a first direction; an active pillar located on the bit line, in which a bottom surface of the active pillar is in contact with the bit line, and the active pillar is doped with an N-type element; an inversion region located on the side surface of the active pillar, and doped with a P-type element; a dielectric layer and a word line extending in a second direction, in which the dielectric layer and the word line wrap part of the inversion region, and the dielectric layer is located between the word line and the inversion region.

17 Claims, 18 Drawing Sheets

(56) References Cited

U.S. PATENT DOCUMENTS

| | | | | |
|---|---|---|---|---|
| 9,059,132 | B2 | 6/2015 | Cheng | |
| 10,998,316 | B2 | 5/2021 | Lee | |
| 11,302,697 | B2 | 4/2022 | Walker | |
| 2001/0007365 | A1 * | 7/2001 | Lee | H10B 12/09 438/386 |
| 2006/0244037 | A1 * | 11/2006 | Kouketsu | H10D 64/693 257/314 |
| 2013/0187279 | A1 * | 7/2013 | Surthi | H01L 21/76897 257/E23.06 |
| 2013/0307056 | A1 * | 11/2013 | Takaishi | H10D 84/0195 257/329 |
| 2014/0264746 | A1 | 9/2014 | Cheng | |
| 2019/0016126 | A1 * | 1/2019 | Hirai | B41J 2/14233 |
| 2021/0233913 | A1 | 7/2021 | Walker | |
| 2022/0189961 | A1 | 6/2022 | Walker | |

FOREIGN PATENT DOCUMENTS

| | | | |
|---|---|---|---|
| CN | 108461496 | A | 8/2018 |
| CN | 110957319 | A | 4/2020 |
| CN | 111785784 | A | 10/2020 |
| CN | 112310079 | A | 2/2021 |

OTHER PUBLICATIONS

CN first office action in application No. 202210038578.0, mailed on Apr. 29, 2026.

* cited by examiner

SEMICONDUCTOR STRUCTURE AND METHOD FOR MANUFACTURING SEMICONDUCTOR STRUCTURE

CROSS-REFERENCE TO RELATED APPLICATION

This application is a U.S. continuation application of International Application No. PCT/CN2022/079804, filed on Mar. 8, 2022, which claims priority to Chinese Patent Application No. 202210038578.0, filed on Jan. 13, 2022. International Application No. PCT/CN2022/079804 and Chinese Patent Application No. 202210038578.0 are incorporated herein by reference in their entireties.

TECHNICAL FIELD

Embodiments of the disclosure relate to the technical field of semiconductors, in particular to a semiconductor structure and a method for manufacturing a semiconductor structure.

BACKGROUND

With the continuous development of integrated circuit process technology, the feature size of a metal-oxide-semiconductor field-effect transistor (MOSFET) device is shrinking continuously, so as to improve the integration of integrated circuits, improve the working speed of a memory and reduce its power consumption. The MOSFET device therefore is facing a series of challenges. For example, in order to reduce the line width of the device, a semiconductor structure has begun to develop from an embedded word line structure to a gate-all-around (GAA) structure. However, it is still necessary to connect the GAA structure to a capacitor required for charge storage. Therefore, the process of capacitor workshop section is complicated and difficult, and the storage capacity is also limited by the size.

How to simplify the process and further improve the storage density has become an important problem to be solved urgently by those skilled in the art.

SUMMARY

According to some embodiments of the disclosure, an aspect of the embodiments of the disclosure provides a method for manufacturing a semiconductor structure including the following operations. A substrate is provided. A bit line extending along a first direction is formed in the substrate. An active pillar is formed on the bit line, has a bottom surface in contact with the bit line and is doped with an N-type element. An inversion region is formed on a side surface of the active pillar, and doped with a P-type element. A dielectric layer and a word line extending along a second direction are formed sequentially, and wrap part of the inversion region. The dielectric layer is located between the word line and the inversion region.

According to some embodiments of the disclosure, another aspect of the embodiments of the disclosure provides a semiconductor structure including: a substrate having a bit line extending along a first direction; an active pillar located on the bit line, having a bottom surface in contact with the bit line, and doped with an N-type element; an inversion region located on a side surface of the active pillar and doped with a P-type element; a dielectric layer and a word line that extends along a second direction that wrap part of the inversion region, in which the dielectric layer is located between the word line and the inversion region.

BRIEF DESCRIPTION OF THE DRAWINGS

One or more embodiments are illustrated with the corresponding figures in the drawings. The exemplary description does not constitute limitations on the embodiments, and the figures in the drawings do not constitute a scale limitation, unless otherwise stated. In order to more clearly illustrate the technical solutions in the embodiments of the disclosure or in the related art, the drawings required for descripting the embodiments will be briefly introduced below. Apparently, the drawings described below are only some embodiments of the disclosure. For a person of ordinary skill in the art, other drawings can be obtained based on these drawings without creative work.

DETAILED DESCRIPTION

Figure 1:
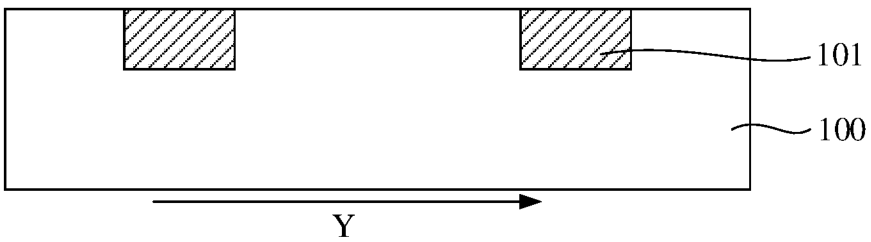
FIG. 1 to FIG. 26 are schematic cross-sectional diagrams corresponding to the structure in the operations of a method for manufacturing a semiconductor structure provided by an embodiment of the disclosure.

The embodiments of the disclosure provide a semiconductor structure and a method for manufacturing a semiconductor structure, in which an active pillar is formed on a bit line, the active pillar has a bottom surface in contact with the bit line and is doped with an N-type element; an inversion region is formed on the side surface of the active pillar and doped with a P-type element; and a dielectric layer and a word line extending along a second direction are sequentially formed to wrap part of the inversion region, in which the dielectric layer is located between the word line and the inversion region. The active pillar can serve as a source or a drain of the semiconductor structure, and the word line can serve as a gate of the semiconductor structure. When a positive voltage is applied to the gate terminal and the drain terminal to form an applied electric-field, an electron-bridge is formed in the active pillar, and the P-type element in the inversion region is converted into an electron-hole pair. Due to the existence of the electron-bridge, an electron can leave the inversion region, but a hole cannot leave the inversion region. Due to the voltage on the gate, there is an inversion layer in the area directly below the gate, and the area below the inversion layer and the isolation layer constitute a hole storage area, thereby fixing the hole under the isolation layers and storing it. When a positive voltage is applied to the gate terminal and a negative voltage is applied to the drain terminal, all holes are driven out of the hole storage area, and migrate and diffuse in the active pillar and the inversion region. In other words, the inversion region has the function of storing charges, and thus can be regarded as an equivalent capacitor. Therefore, it can simplify the process flow for manufacturing a capacitor and is beneficial to reducing the line width of the semiconductor structure. Thus the size of the capacitor can be larger, so as to ensure that the storage capacity of the capacitor is larger, which is beneficial to improving the storage density of the semiconductor structure.

The embodiments of the disclosure are described in detail below with reference to the accompanying drawings. However, an ordinary person skilled in the art can understand that in the embodiments of the disclosure, many technical details are provided in order to make readers better understand the embodiments of the disclosure. However, even without these technical details, and variations and modifications based on the following embodiments, the technical solutions claimed by the embodiments of the disclosure can be realized.

FIG. 1 to FIG. 26 are schematic cross-sectional diagrams corresponding to the structure in the operations of a method for manufacturing a semiconductor structure provided by an embodiment of the disclosure, in which FIG. 1 to FIG. 13 are schematic cross-sectional diagrams corresponding to the structure along a second direction Y in the operations of a method for manufacturing a semiconductor structure provided by an embodiment of the disclosure, and FIG. 14 to FIG. 26 are schematic cross-sectional diagrams corresponding to the structure along a first direction X in the operations of a method for manufacturing a semiconductor structure provided by an embodiment of the disclosure.

Figure 14:
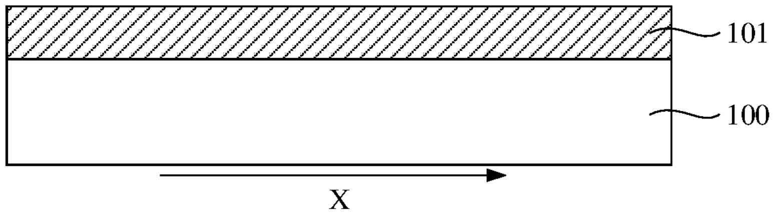

Referring to FIG. 1 or FIG. 14, a substrate 100 is provided, and a bit line 101 extending along a first direction X is formed in the substrate 100.

In some embodiments, the orthographic projection of the second direction Y and the orthographic projection of the first direction X on the substrate 100 are perpendicular to each other. The material of the substrate 100 may be a semiconductor material. The semiconductor material may be any one of silicon, germanium, silicon germanium or silicon carbide.

In some embodiments, the bit line 101 is formed by an epitaxy growth process. The formation of the bit line may include the following operations. An initial substrate is provided, and has a channel (not shown in the drawings) extending along the first direction. The bit line 101 is formed, and fills up the channel. The bit line 101 is a semiconductor bit line doped with an N-type element that can be used as carriers, which can improve the migration and diffusion of carriers between the bit line 101 and an subsequently formed active pillar, thereby being beneficial to improve the conductivity of the bit line 101 and the active pillar. Specifically, the N-type element may be doped in-situ, and may be a group V element such as phosphorus (P), bismuth (Bi), antimony (Sb), or arsenic (As). The material of the bit line 101 is the same as that of the initial substrate, and may be any one of silicon, germanium, silicon germanium, or silicon carbide.

In other embodiments, the N-type element can be implanted into the substrate 100 by an ion implantation process or a diffusion process to form a semiconductor bit line, i.e., the bit line 101 and the substrate 100 are integrated, thus improving performances of the interface between the bit line 101 and the substrate 100, being beneficial to reducing interface state defects, and in turn improving electrical performances of the semiconductor structure.

In still other embodiments, the bit line 101 is a metal bit line. The semiconductor structure further includes a bit line barrier layer located between the substrate 100 and the metal bit line and a bit line dielectric layer located on the surface away from the bit line barrier layer of the metal bit line. The resistance of the metal is low, which is beneficial to improving the conductivity of the bit line 101 and an active pillar formed subsequently, and in turn improving the conductivity of the bit line 101. Specifically, the material of the metal bit line may be tungsten, copper, or silver, the material of the bit line barrier layer may be silicon nitride, silicon oxide or silicon carbide, and the material of the bit line dielectric layer may be silicon oxide or silicon nitride.

Referring to FIG. 2 to FIG. 7 and FIG. 15 to FIG. 20, a first isolation layer 110, a sacrificial layer 102 and a second isolation layer 130 are stacked and formed in sequence on the substrate 100 and the top surface of the bit line 101. The second isolation layer 130 has a through hole 114 penetrating through the second isolation layer 130 along its thickness direction. The sacrificial layer 102 is exposed at the bottom of the through hole 114. The sacrificial layer 102 is removed to expose the side surface of an active pillar 120.

Figure 2:
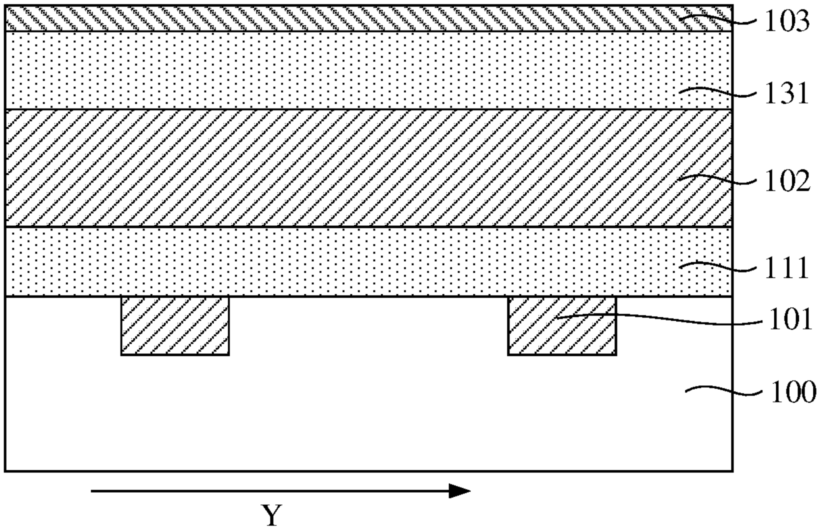
Figure 15:
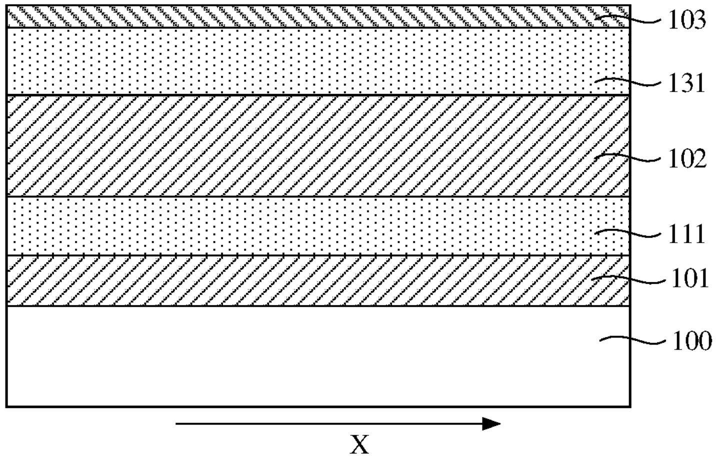

Specifically, referring to FIG. 2 or FIG. 15, a first isolation film 111, a sacrificial layer 102, a second isolation film 131, and a first mask layer 103 having a first opening (not shown in the drawings) are stacked and formed in sequence on the substrate 100 and the top surface of the bit line 101.

In some embodiments, the material of the sacrificial layer 102 is different from that of the first isolation film 111 and that of the second isolation film 131, and the material of the first mask layer 103 is different from that of the sacrificial layer 102, that of the first isolation film 111 and that of the second isolation film 131. The material of the sacrificial layer 102 may be silicon nitride or silicon oxide. The material of the first isolation film 111 is an insulating material, which may be silicon dioxide, silicon carbide or silicon nitride. The material of the second isolation film 131 is the same as that of the first isolation film 111. In other embodiments, the material of the second isolation film may also be differs from that of the first isolation film.

Figure 3:
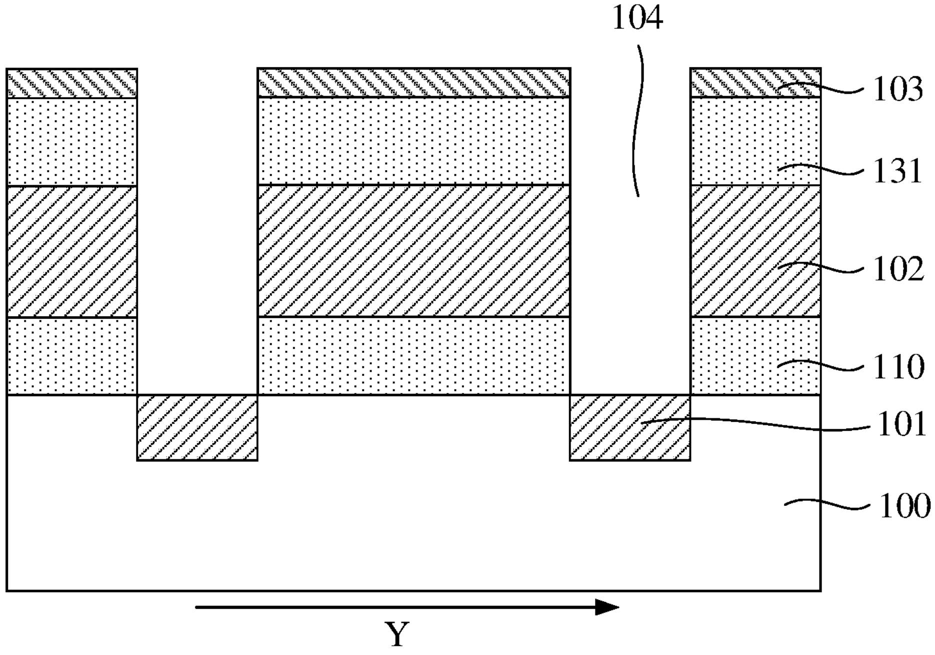
Figure 16:
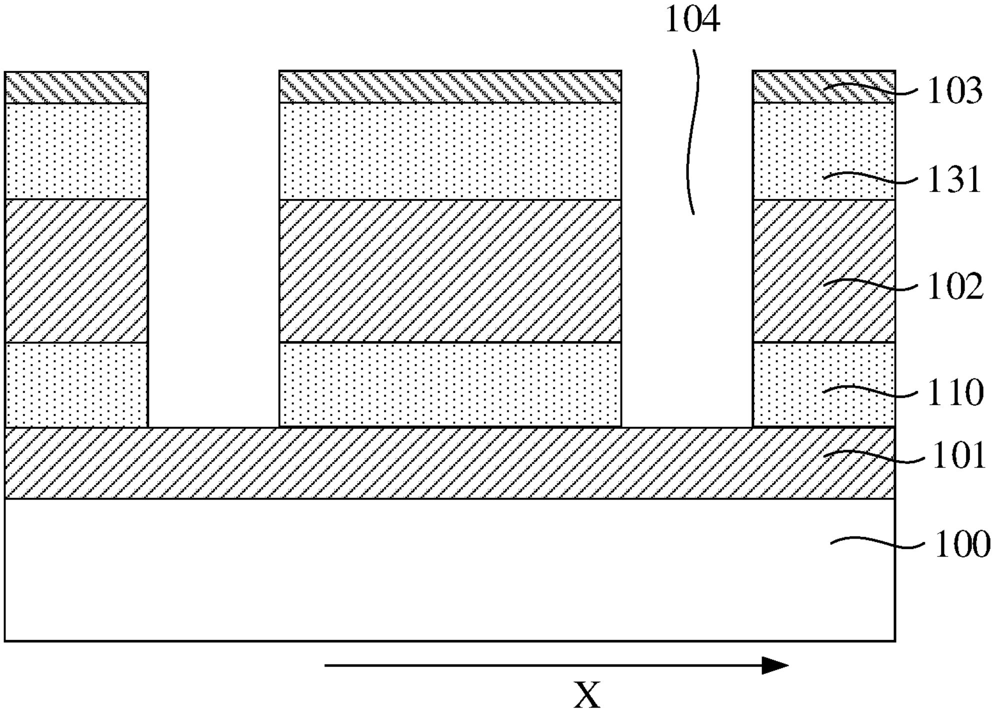

Referring to FIG. 3 or FIG. 16, the first mask layer 103, the second isolation film 131, the sacrificial layer 102, and the first isolation film 111 are etched in sequence along the first opening by taking the first mask layer 103 as a mask to form a trench 104. The bit line 101 is exposed at the bottom of the trench 104, and a remaining part of the first isolation film 111 is used as the first isolation layer 110. The bit line 101 is exposed at the bottom of the trench 104, so that the bit line is connected to the active pillar subsequently formed, and the bottom of trench 104 can be used as a substrate for epitaxy growth of the active pillar to improve the integrity of the active pillar subsequently formed.

Figure 4:
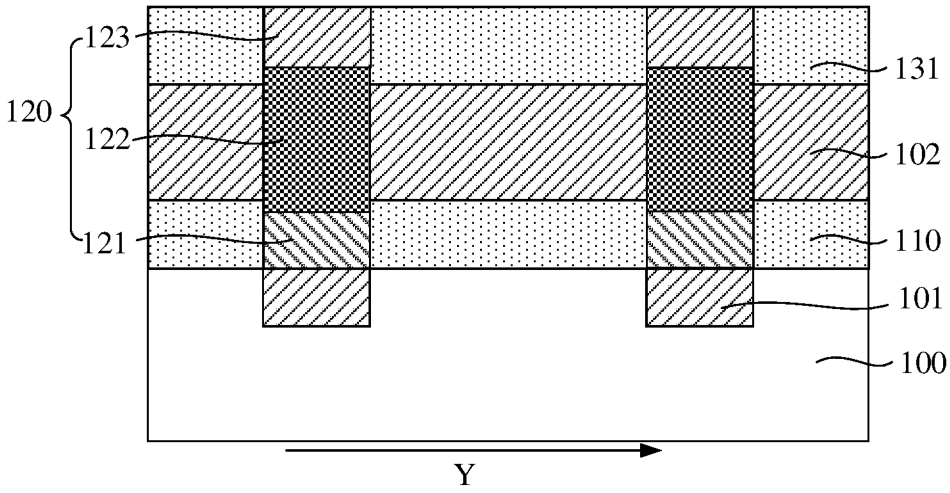
Figure 17:
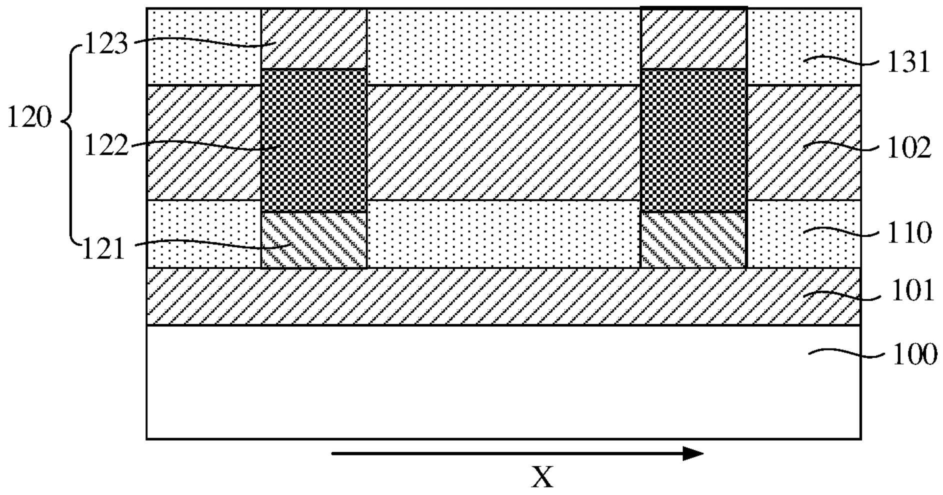

Referring to FIG. 4 or FIG. 17, the active pillar 120 is formed on the bit line 101. The bottom surface of the active pillar 120 is in contact with the bit line 101. And the active pillar 120 is doped with an N-type element and fills up the trench 104.

In some embodiments, the active pillar 120 includes a first region 121, a second region 122 and a third region 123 that are distributed from the surface of the substrate 100 to a direction away from the substrate 100 in sequence. The first region 121, the second region 122, and the third region 123 may be regarded as the bulk of the active pillar 120. The bulk of the active pillar 120 may be an intrinsic semiconductor, and an intrinsic semiconductor material may be silicon, germanium, or silicon germanium. It can be understood that the intrinsic semiconductor is a semiconductor that has not been doped.

In some embodiments, the second region 122 is doped with the N-type element and the doping element in the second region 122 may be the same as that in the bit line

101. In other embodiments, the doping element in the second region 122 may be different from that in the bit line 101. For example, the bit line 101 is doped with phosphorus, while the second region 122 is doped with arsenic; the first region 121, the second region 122 and the third region 123 are doped with the N-type element.

It should be noted that the active pillar 120 is formed by a low-pressure chemical vapor deposition process. Material Sources used in the low pressure chemical vapor deposition process include a gas source and an N-type element gas source used for providing the N-type element. The gas source may be a silicon source gas, and specifically the silicon source gas may be silane, disilane, dichlorosilane or trichlorosilane. The N-type element gas source may specifically be phosphine, arsenic hydride or antimony hydride. In other embodiments, the gas source may also be a germanium source gas, which may specifically be germane.

In some embodiments, the material of the active pillar 120 is the same as that of the bit line 101, so that the lattice mismatch factor between the active pillar 120 and the bit line 101 is 0, which effectively avoids the problems of lattice defects and internal resistance increase in the active pillar 120, and is beneficial to improving the conductivity of the active pillar 120. In other embodiments, the material of the active pillar 120 may be different from that of the bit line 101.

Figure 5:
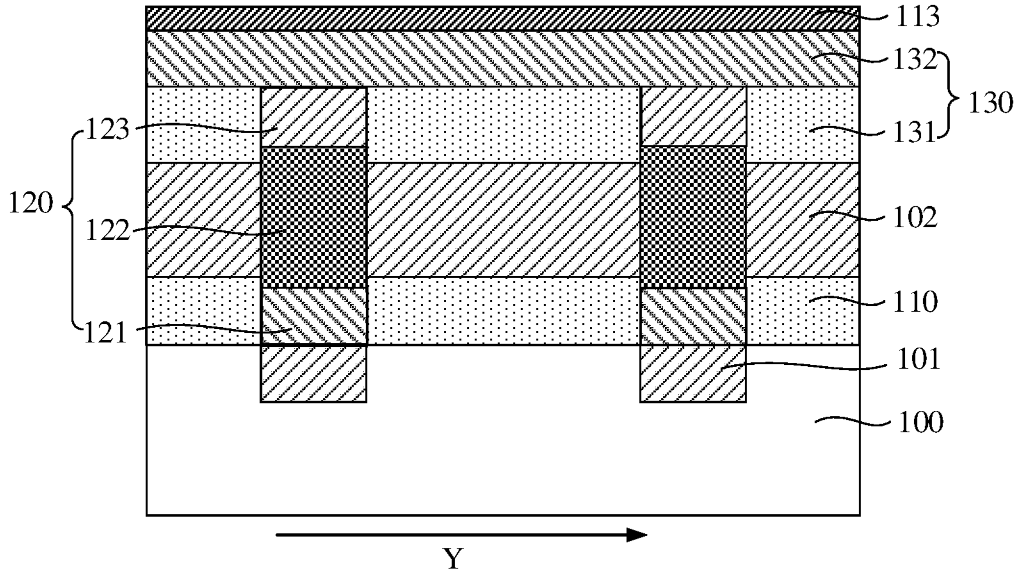
Figure 18:
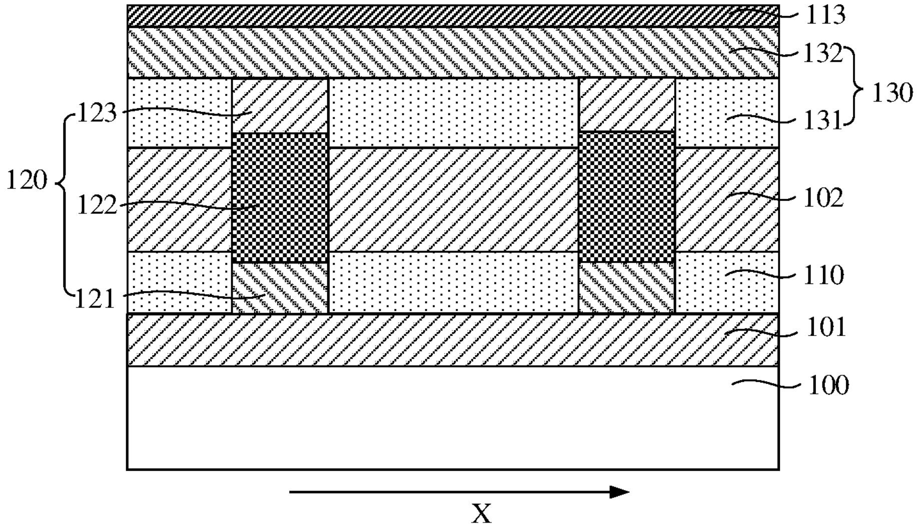

Referring to FIG. 5 or FIG. 18, a third isolation film 132 and a second mask layer 113 are formed on the second isolation film 131 in sequence. The third isolation film 132 covers the top surface of the active pillar 120.

In some embodiments, the material of the third isolation film 132 may be the same as that of the second isolation film 131. In other embodiments, the material of the third isolation film may be different from that of the second isolation film.

Figure 6:
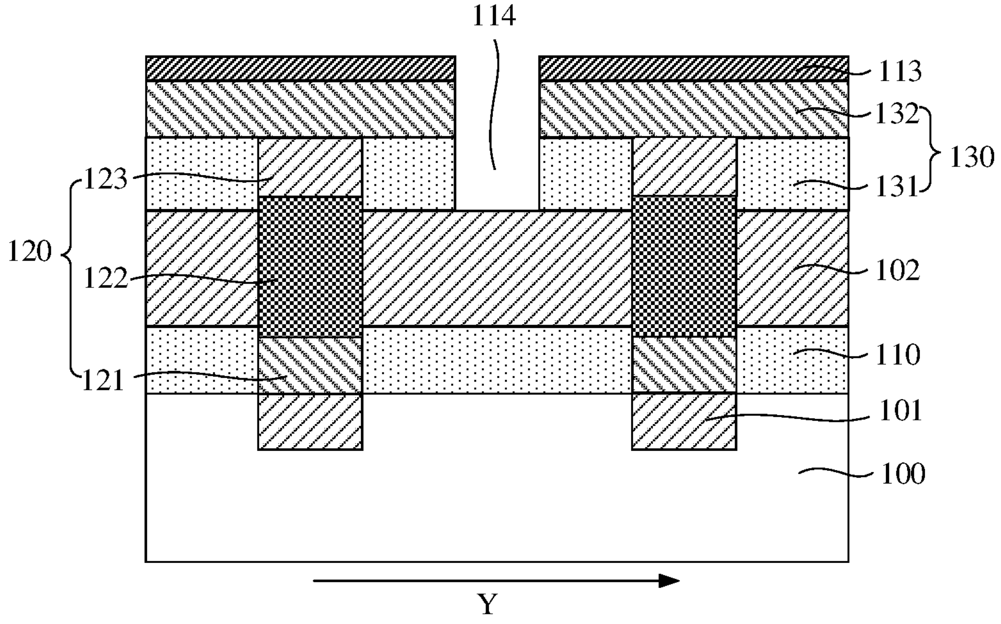
Figure 19:
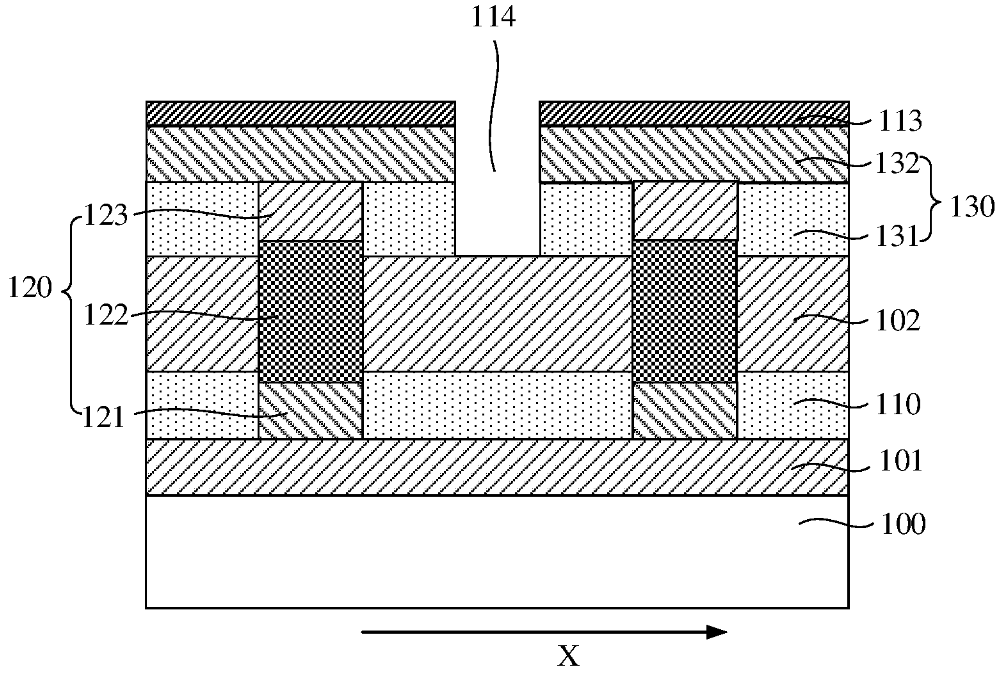

Referring to FIG. 6 or FIG. 19, the second mask layer 113, the third isolation film 132, and the second isolation film 131 are patterned to form a through hole 114, and the remaining part of the second isolation film 131 and the remaining part of the third isolation film 132 are together used as the second isolation layer 130.

In some embodiments, the sacrificial layer 102 is exposed at the bottom of the through hole 114, facilitating subsequently removing the sacrificial layer 102 by etching to form an inversion region and a word line.

Figure 7:
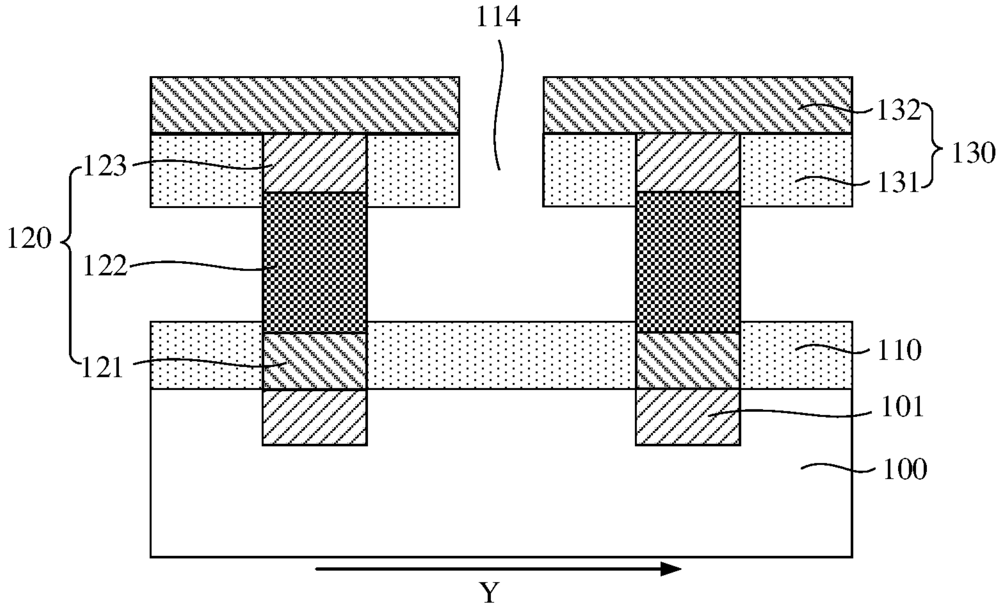
Figure 20:
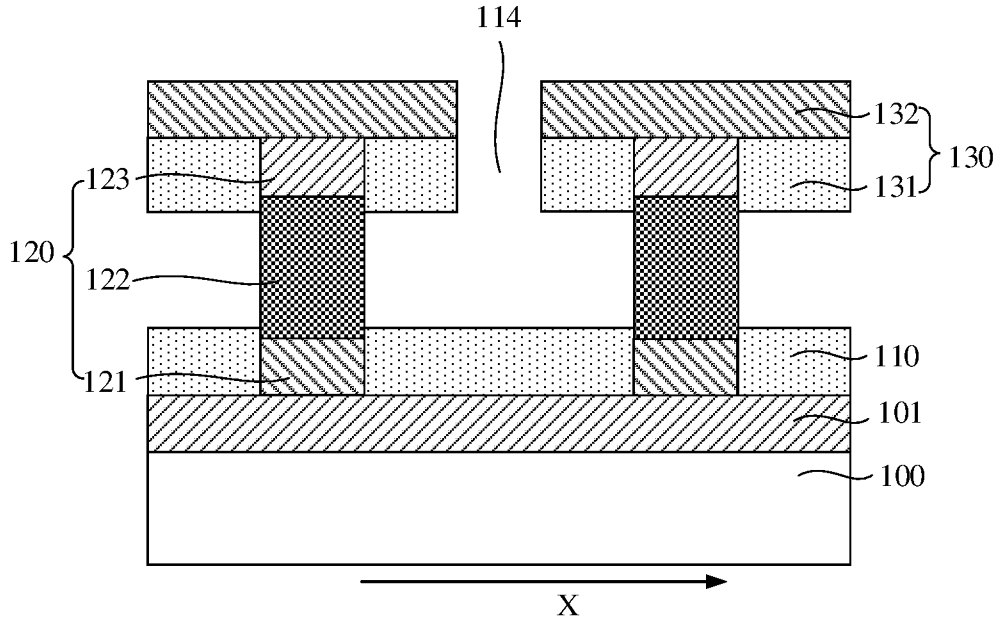

Referring to FIG. 7 or FIG. 20, the sacrificial layer 102 and the second mask layer 113 are removed to expose the side surface of the active pillar 120.

It should be noted that when removing the sacrificial layer 102 by a wet etching process, the etching temperature is kept between 140° C. and 200° C., specifically at 160° C. In some embodiments, the etching solution used in the wet etching process is a hot phosphoric acid etching solution made up of 85% concentrated phosphoric acid and 15% deionized water. In other embodiments, the etching solution used in the wet etching process is a solution of 49% hydrofluoric acid.

Figure 8:
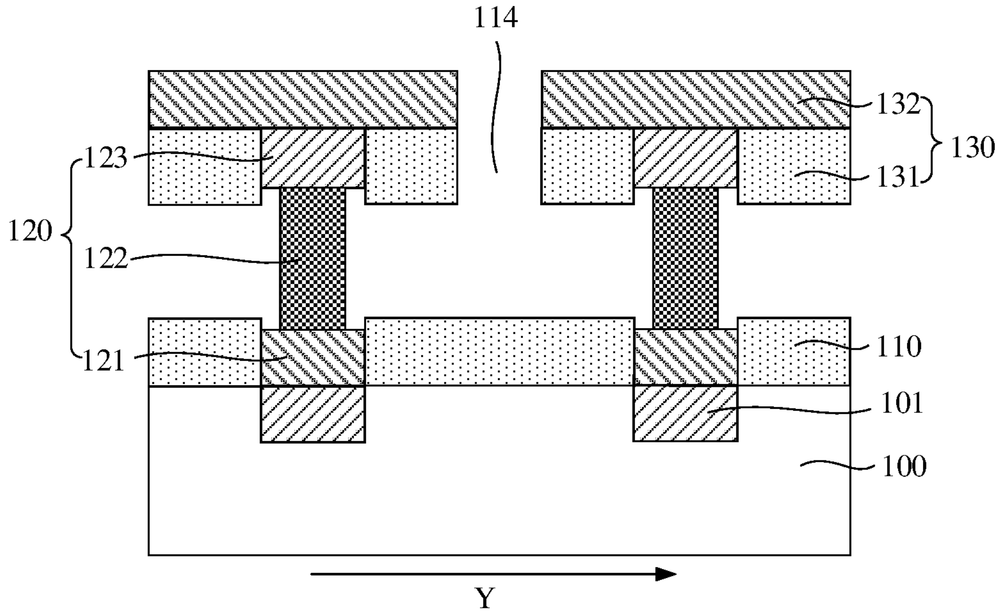
Figure 21:
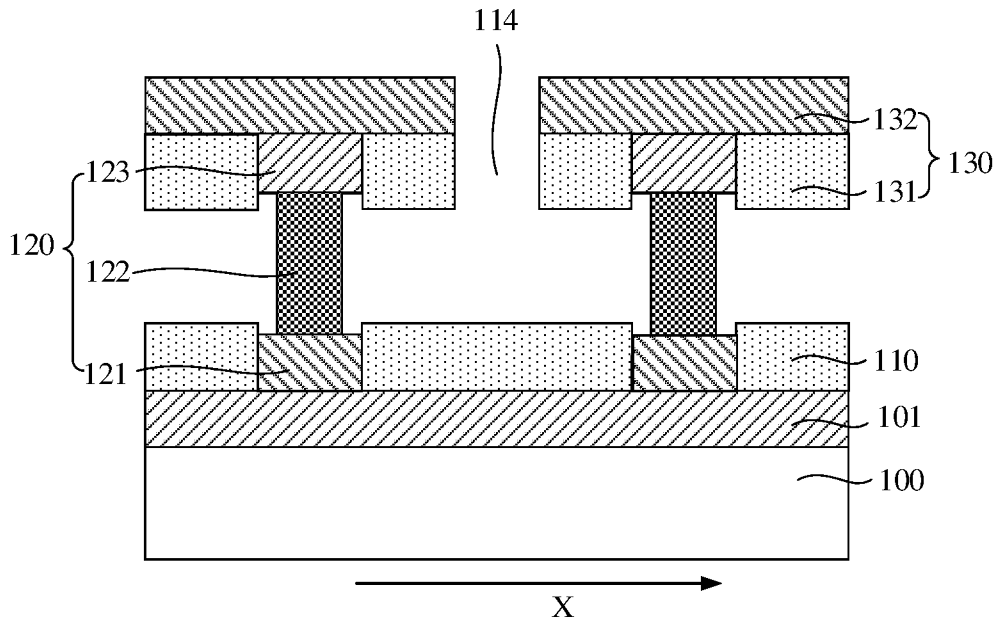

Referring to FIG. 8 or FIG. 21, part of the sidewall of the active pillar 120 is thinned along a thickness direction of the active pillar.

In some embodiments, the sidewall of the second region 122 is thinned. The thinning is carried out by a wet etching process. An etching liquid used in the wet etching process is an alkaline liquid, which may be an alkaline copper chloride etching liquid.

It can be understood that, because of the isotropy of the wet etching process, not only the exposed sidewall of the second region 122 is thinned, but also the sidewall, located at the side surface of the first isolation layer 110 and the side surface of the second isolation layer 130, of the second region 122 is etched.

Figure 9:
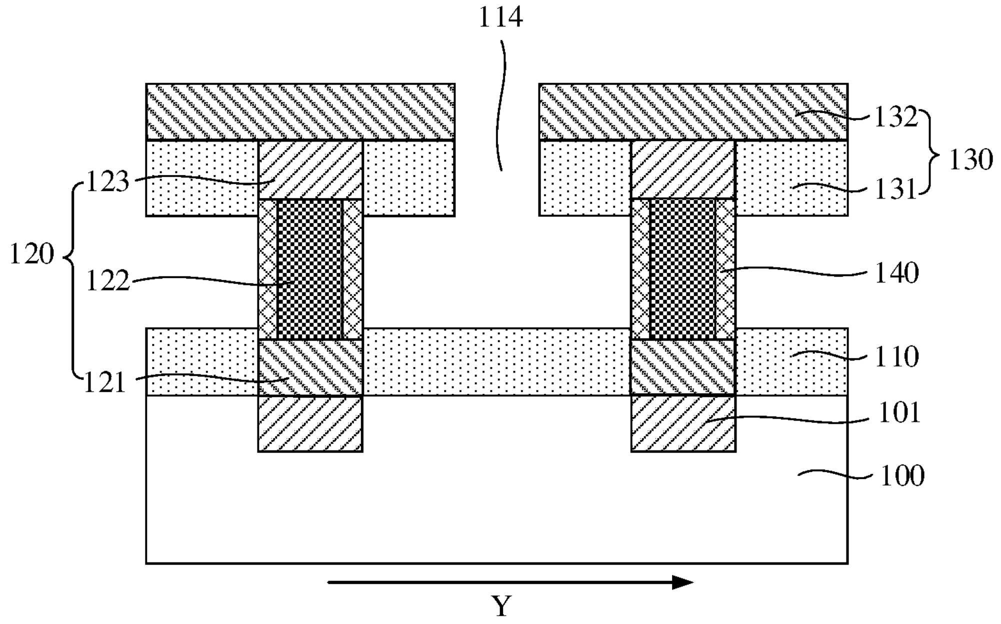
Figure 22:
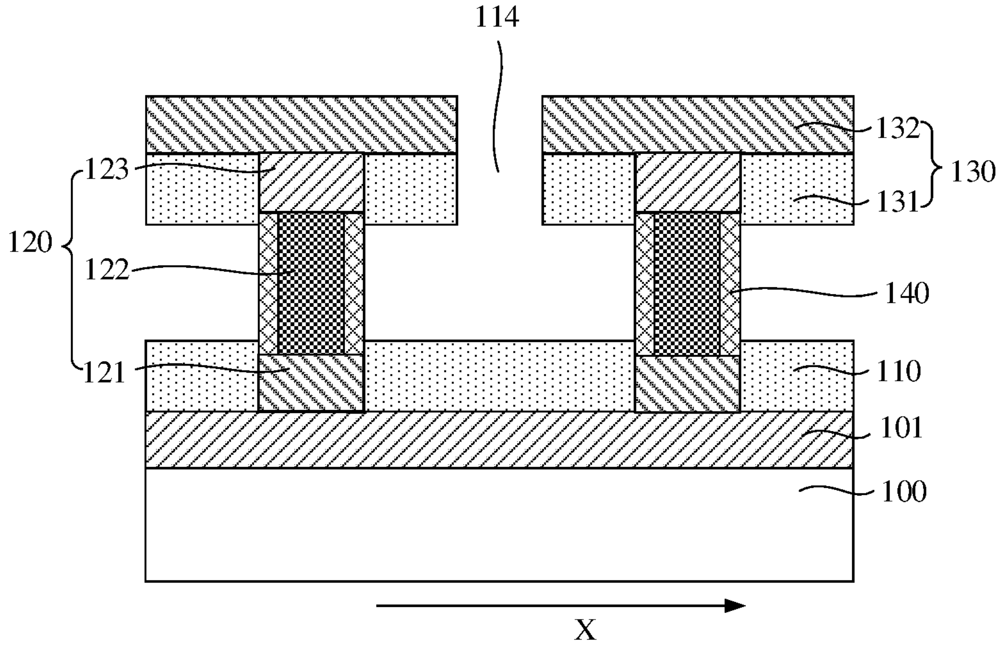

Referring to FIG. 9 or FIG. 22, an inversion region 140 doped with a P-type element is formed on the side surface of the active pillar 120.

In some embodiments, the inversion region 140 is formed on the side surface of the thinned second region 122. The second region 122 is doped with the N-type element, and the inversion region 140 is doped with the P-type element. That is, the doping element type of the second region 122 is opposite to that of the inversion region 140. The active pillar 120 can serve as a source or a drain of the semiconductor structure, and the word line subsequently formed and wrapping the inversion region 140 can serve as a gate of the semiconductor structure. When a positive voltage is applied to the gate terminal and the drain terminal to form an applied electric-field, an electron-bridge is formed in the active pillar 120, and the P-type element in the inversion region 140 is converted into an electron-hole pair. Electrons can leave the inversion region 140 along the electron-bridge, while holes cannot leave the inversion region 140. That is to say, the inversion region 140 can store holes, i.e., the inversion region 140 has the function of storing charges, and thus can be regarded as an equivalent capacitor, which is beneficial to reducing the line width of the semiconductor structure and improving the integration of the semiconductor structure. The P-type element may be a group III element such as boron (B), aluminum (Al), gallium (Ga), or indium (In).

In some embodiments, the inversion region 140 has a thickness in a range of 4 nm to 15 nm in the direction perpendicular to the sidewall of the active pillar 120 and toward the axial center of the active pillar 120. The thickness of the inversion region 140 may be specifically 4 nm, 8 nm, 13 nm or 15 nm. The thickness range of the inversion region 140 should ensure that the area for storing the holes in the inversion region 140 is large and thus can accommodate more holes (i.e., the capacity of the capacitor is larger), which ensures that the storage capacity of the capacitor is larger, thereby being beneficial to improving the storage density of the semiconductor structure, and also avoiding the issue that the width of the word line formed subsequently is too small because the width of the inversion region 140 in the horizontal direction of the semiconductor structure is too large.

In some embodiments, in the direction parallel to the side surface of the active pillar 120, the overall height of the inversion region 140 is 8 nm to 30 nm higher than the height of part, wrapped by the dielectric layer and the word line, of the inversion region 140. That is, the height of the inversion region 140 located at the side surfaces of the first isolation layer 110 and the third isolation layer 130 is in a range of 8 nm to 30 nm, and may specifically be 8 nm, 10 nm, 20 nm or 30 nm. In this way, it can be ensured that the area for storing holes in the inversion region 140 is large, and thus can accommodate more holes (i.e., the capacity of the capacitor is larger), which ensures that the storage capacity of the capacitor is larger, thereby being beneficial to improving the storage density of the semiconductor structure, and also avoiding the issue of too that the inversion region 140 occupies an excessive line width in the perpendicular direction of the semiconductor structure. In one specific example, the height of the inversion region 140 located at the side surface of the second region 122 is 20 nm, i.e. the height of the part, wrapped by the dielectric layer and the word line formed subsequently, of the inversion region 140 is 20 nm, and the total height of the inversion region 140 located at the side surfaces of the first isolation layer 110 and the third isolation layer 130 is 8 nm, so the overall height of the inversion region 140 can be 28 nm.

In some embodiments, in the direction parallel to the side surface of the active pillar 120, the height of the inversion region 140 located on the side surface of the first isolation layer 110 may be equal to the height of the inversion region 140 located on the side surface of the third isolation layer 130, and the side surface of the inversion region 140 is flush with the side surface of the first region 121 and the side surface of the third region 123. In other words, the orthographic projection of the inversion region 140 on the substrate 100 falls in and coincides with the orthographic projection of the first region 121 on the substrate 100, which is beneficial to improving the flatness of the surface of the dielectric layer subsequently formed.

In some embodiments, the inversion region 140 may be partially doped. In addition, in the direction perpendicular to the surface of the substrate 100, the inversion region 140 includes two doped parts and a bulk located between adjacent doped parts. The bulk may be un-doped. The bulk material of the inversion region 140 includes silicon, germanium or silicon germanium.

In some embodiments, when the bulk material of the inversion region 140 and the bulk material of the active pillar 120 are the same, the lattice mismatch factor between the active pillar 120 and the inversion region 140 is 0, which effectively avoids the problems of lattice defects and internal resistance increase in the inversion region 140, and is beneficial to improving the conductivity of the inversion region 140. In other embodiments, the bulk material of the inversion region 140 and the bulk material of the active pillar 120 may be different.

In some embodiments, a selective epitaxy growth (SEG) process is adopted to form the inversion region 140. During the formation of the inversion region 140, the P-type element is doped in situ. The source materials used in the selective epitaxy growth process include a source gas, an etching gas such as hydrogen chloride, and a doping element source gas. The doping element source gas is used for providing the P-type element. The source gas may be a silicon source gas, and the silicon source gas may specifically be silane, disilane, dichlorosilane or trichlorosilane. The doping element source gas may be borane ($BH_3$), diborane ($B_2H_6$) or boron trichloride ($BCl_3$). In other embodiments, the source gas may also be a germanium source gas, which may specifically be germane.

Referring to FIG. 10 to FIG. 12 and FIG. 23 to FIG. 25, a dielectric layer 150 and a word line 160 extending along the second direction Y are formed in sequence to wrap part of the inversion region 140. The dielectric layer 150 is located between the word line 160 and the inversion region 140.

In some embodiments, the word line 160 can serve as a gate of the semiconductor structure. The word line 160 extending along the second direction Y wraps part of the inversion region 140, and the inversion region 140 is located at the side surface of the active pillar 120. That is, the word line 160 also wraps part of the active pillar 120. Therefore, the semiconductor structure is a GAA structure, and realizes the four-sided wrapping of the active pillar 120 by the gate, which can avoid the leakage current, capacitance effect and short-channel effect caused by the reduction of the gate spacing size, reduce the occupied line width of the word line 160 in the vertical direction, and is beneficial to enhancing the gate control performance and improving the integration of the semiconductor structure.

Figure 10:
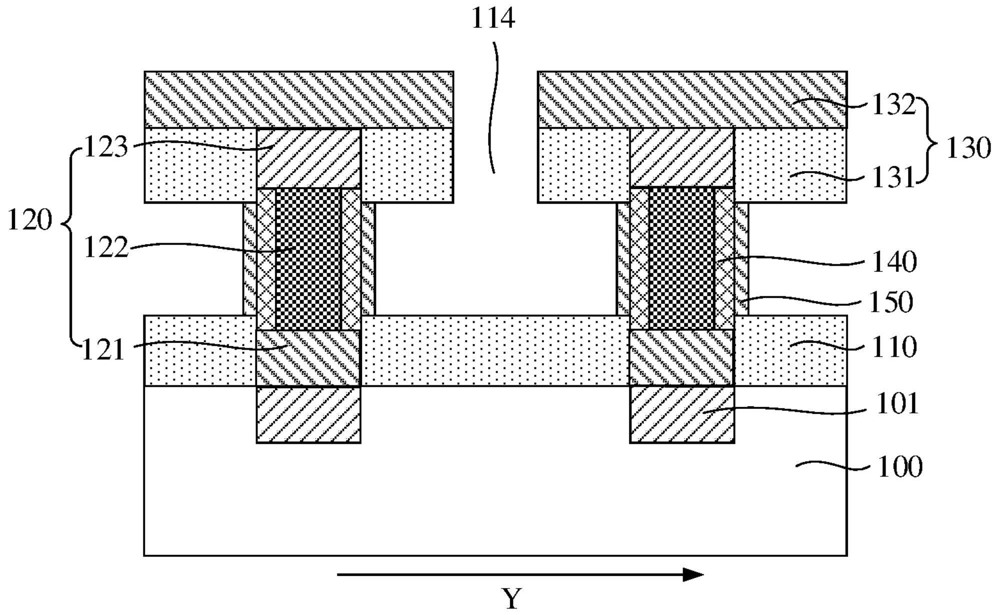
Figure 23:
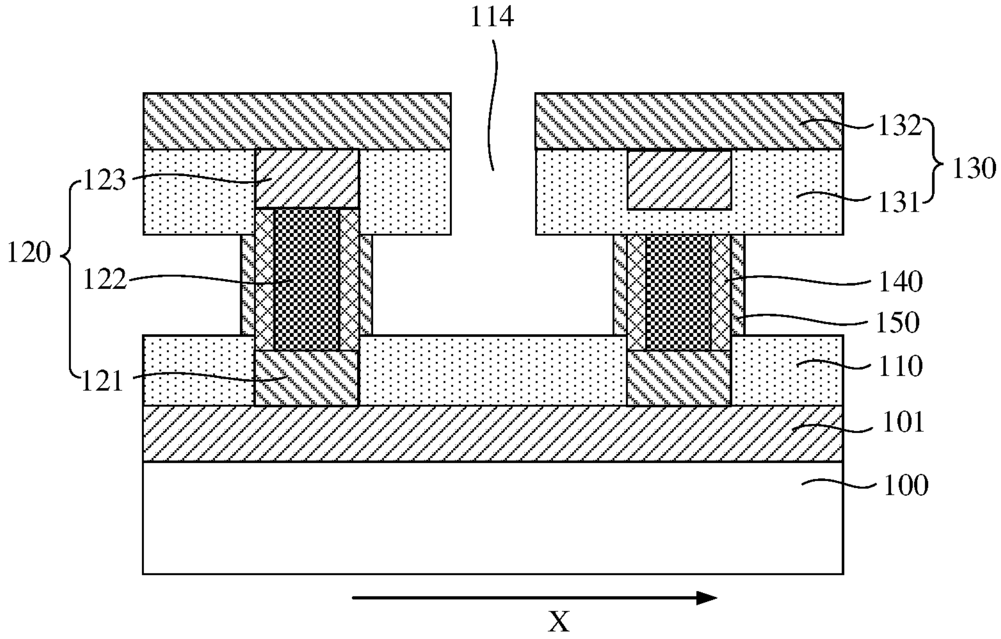

Specifically, referring to FIG. 10 or FIG. 23, a dielectric layer 150 is formed on the side surface of the inversion region 140. The dielectric layer 150 wraps part of the inversion region 140.

The dielectric layer 150 serves as a gate dielectric layer or a gate oxide layer to suppress a short channel effect, for example, to suppress the tunneling leakage current. The material of the dielectric layer 150 may be silicon dioxide, silicon carbide, silicon nitride or other high dielectric constant materials.

Figure 11:
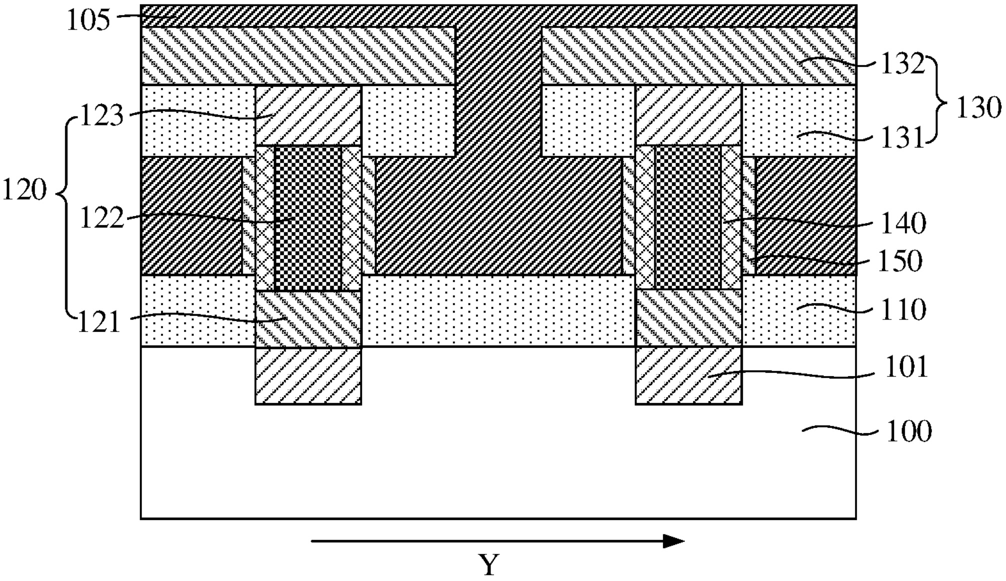
Figure 24:
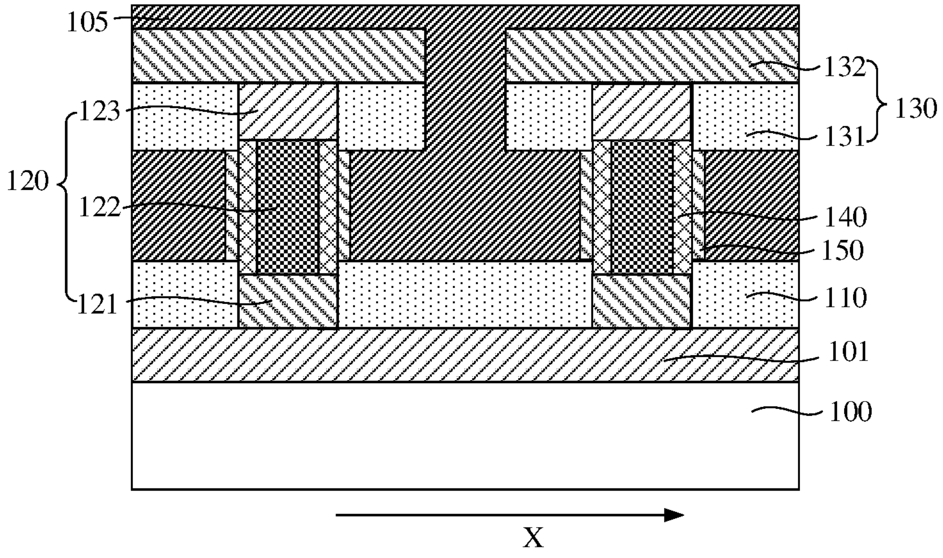

Referring to FIG. 11 or FIG. 24, a conducting film 105 is formed by filling up the through hole 114, located between the first isolation layer 110 and the second isolation layer 130, and surrounds the inversion region 140.

In some embodiments, the conducting film 105 is located on the surface of the dielectric layer 150, surrounds the dielectric layer 150 and extends in the second direction Y. The material of the conducting film 105 may be any one of metal tungsten, copper or aluminum.

It can be understood that the second direction Y may be any direction perpendicular to the sidewall of the active pillar 120 and toward the axial central of the active pillar 120. The second direction Y in the embodiments of the disclosure is a direction perpendicular to the orthographic projection of the first direction X on the substrate 100, which is for exemplary descriptions only.

Figure 12:
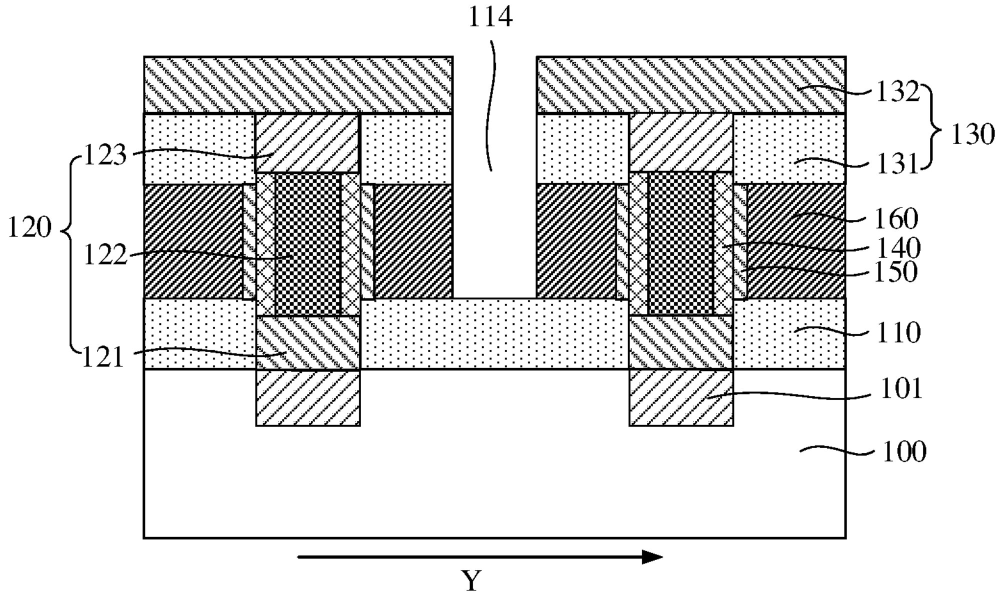
Figure 25:
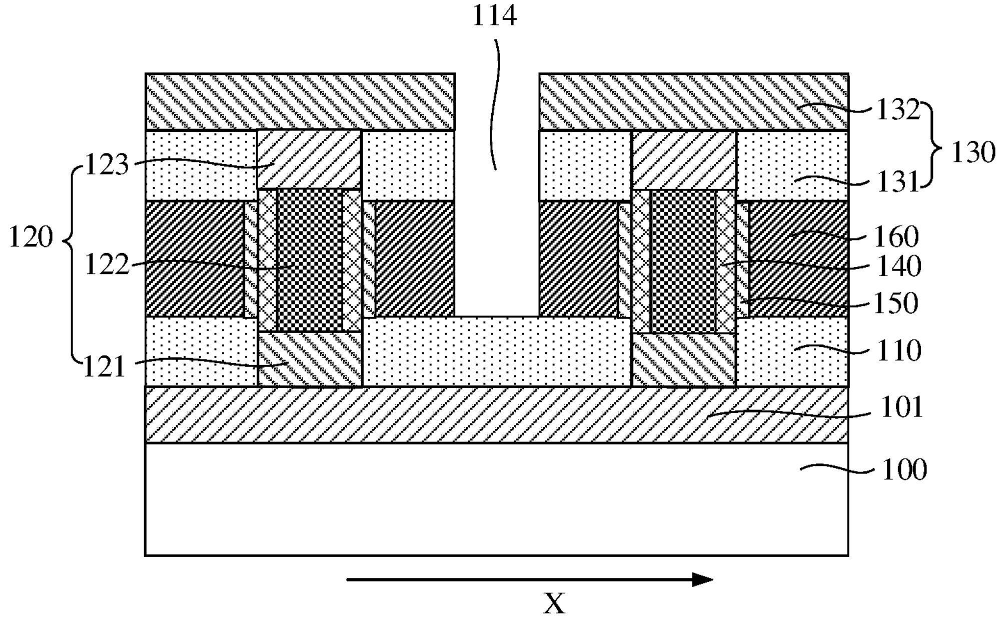

Referring to FIG. 12 or FIG. 25, the conducting film 105 is patterned to form a plurality of mutually discrete word lines 160.

In some embodiments, the operation of patterning the conducting film 105 includes the following operations. The conducting film 105 located in the through hole 114 and directly below the through hole 114 is removed, and the remaining part of the conducting film 105 is used as the word lines 160.

Figure 13:
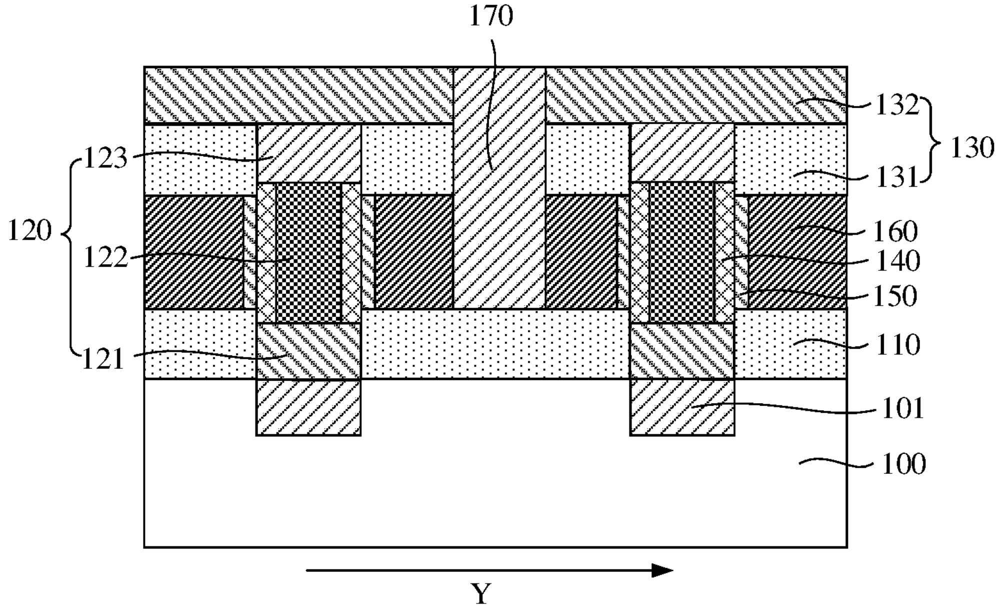
Figure 26:
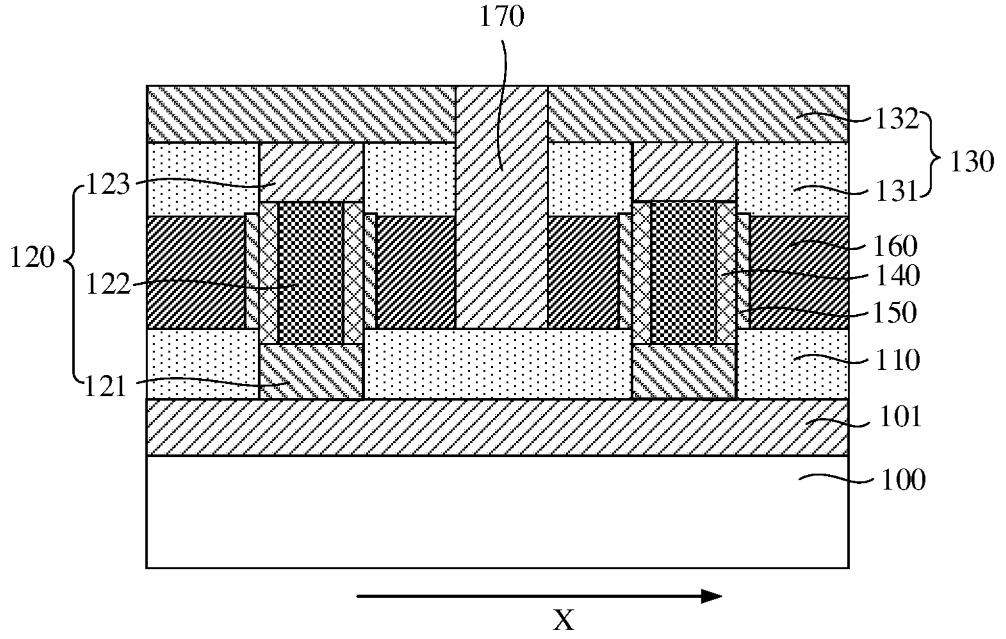

Referring to FIG. 13 or FIG. 26, an insulating layer 170 is formed and fills up the through hole 114. The insulating layer 170 also fills up the region between adjacent word lines 160.

In some embodiments, the material of the insulating layer 170 may be silicon dioxide, silicon carbide or silicon nitride. As the materials of the first isolation layer 110, the second isolation layer 130 and the insulating layer 170 are the same, interface defects between the first isolation layer 110 and the insulating layer 170 and between the second isolation layer 130 and the insulating layer 170 can be reduced. In some other embodiments, the materials of the first isolation layer 110, the second isolation layer 130 and the insulating layer 170 may be different from each other or both of them may be the same.

In the technical solutions provided by the embodiments of the disclosure, the active pillar 120 is doped with the N-type element, the inversion region 140 is located at the side surface of the active pillar 120 and doped with the P-type element, the word line 160 extending in the second direction Y wraps part of the inversion region 140, and the doping element type of the active pillar 120 is opposite to that of the inversion region 140. The active pillar 120 may serve as the source or the drain of the semiconductor structure, and the word line 160 may serve as the gate of the semiconductor structure. When the positive voltage is applied to the gate terminal and the drain terminal to form the applied electric-field, the electron-bridge is formed in the active pillar 120, and the P-type element in the inversion region 140 is converted into the electron-hole pair. The electrons can leave the inversion region along the electron-bridge, while the holes cannot leave the inversion region. That is to say, the inversion region 140 can store the holes, i.e. the inversion region 140 has the function of storing the charges. Therefore, the inversion region 140 can be regarded as the equivalent capacitor, which can simplify the process for preparing a capacitor and is beneficial to reducing the line width of the semiconductor structure. Therefore, the capacitor with the larger size can ensure a larger storage capacity of the capacitor, which is beneficial to improving the storage density of the semiconductor structure.

As an example, the aforementioned (the semiconductor structure as shown in FIG. 1 to FIG. 26) is a preparation method in which the first isolation layer, the sacrificial layer and the second isolation layer are formed firstly, and then the active pillar is formed. Some other embodiments of the disclosure provide a preparation method in which the active pillar is formed firstly, and then the first isolation layer, the sacrificial layer and the second isolation layer are formed. Details of contents or elements identical or similar to those given in the foregoing embodiments will not be repeated, and only descriptions different from those described above will be described in detail. The following will illustrate in detail with reference to FIG. 27 to FIG. 37.

FIG. 27 to FIG. 37 are schematic cross-sectional diagrams corresponding to the structure in operations of a method for preparing a semiconductor structure provided by another embodiment of the disclosure. Referring to FIG. 27 to FIG. 31, a substrate 200 is provided; a bit line 201 extending in a first direction X is formed in the substrate 200; an active pillar 220 is formed on the bit line 201, in which the bottom surface of the active pillar 220 is in contact with the bit line 201, and the active pillar 220 is doped with an N-type element; an inversion region 240 is formed at a side surface of the active pillar 220, and doped with a P-type element; a dielectric layer 250 and a word line 260 extending in the second direction Y are formed in sequence to wrap part of the inversion region 240, in which the dielectric layer 250 is located between the word line 260 and the inversion region 240.

Figure 27:
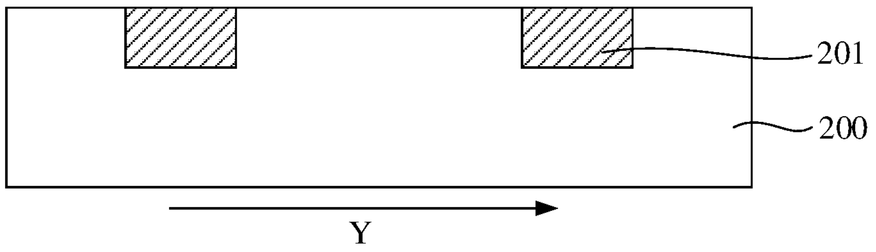
FIG. 27 to FIG. 37 are schematic cross-sectional diagrams corresponding to the structure in the operations in a method for manufacturing a semiconductor structure provided by another embodiment of the disclosure.

Referring to FIG. 27, the substrate 200 is provided, and is proved with the bit line 201 extending in the first direction X.

Figure 28:
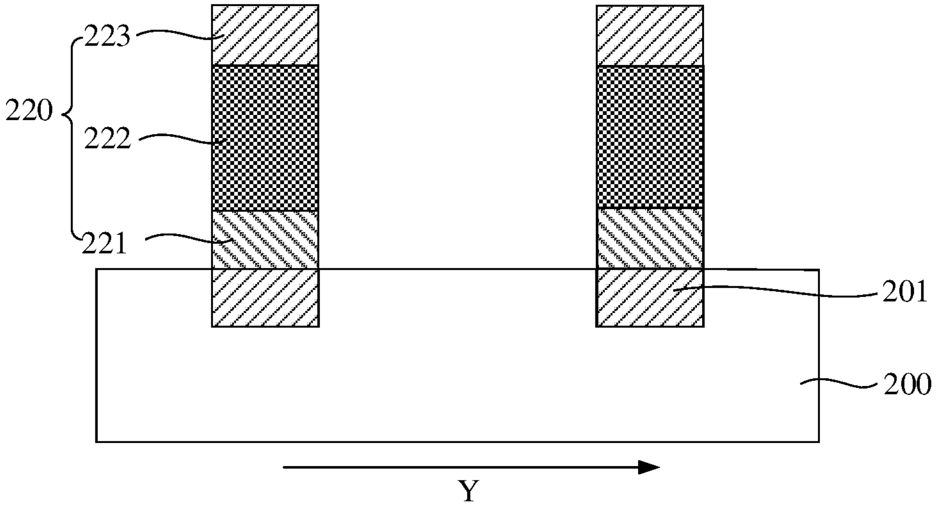

Referring to FIG. 28, the active pillar 220 is formed on the substrate 200. The active pillar 220 includes a first region 221, a second region 222, and a third region 223 that are distributed from the surface of the substrate 200 to a direction away from the substrate 200 in sequence. The second region 222 of the active pillar is doped with N-type ions.

Figure 29:
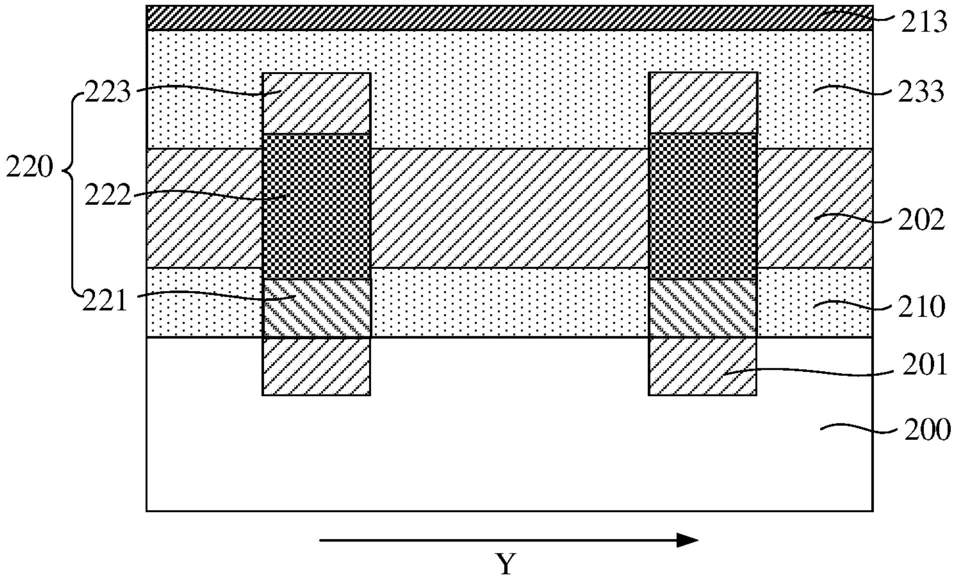

Referring to FIG. 29, a first isolation layer 210, a sacrificial layer 202, a fourth isolation film 233, and a second mask layer 213 are stacked and formed on the substrate 200 in sequence. The sacrificial layer 202 is also located at part of the side surface of the active pillar 220, and the fourth isolation film 233 is located at the top surface and part of the side surface of the active pillar 220.

Figure 30:
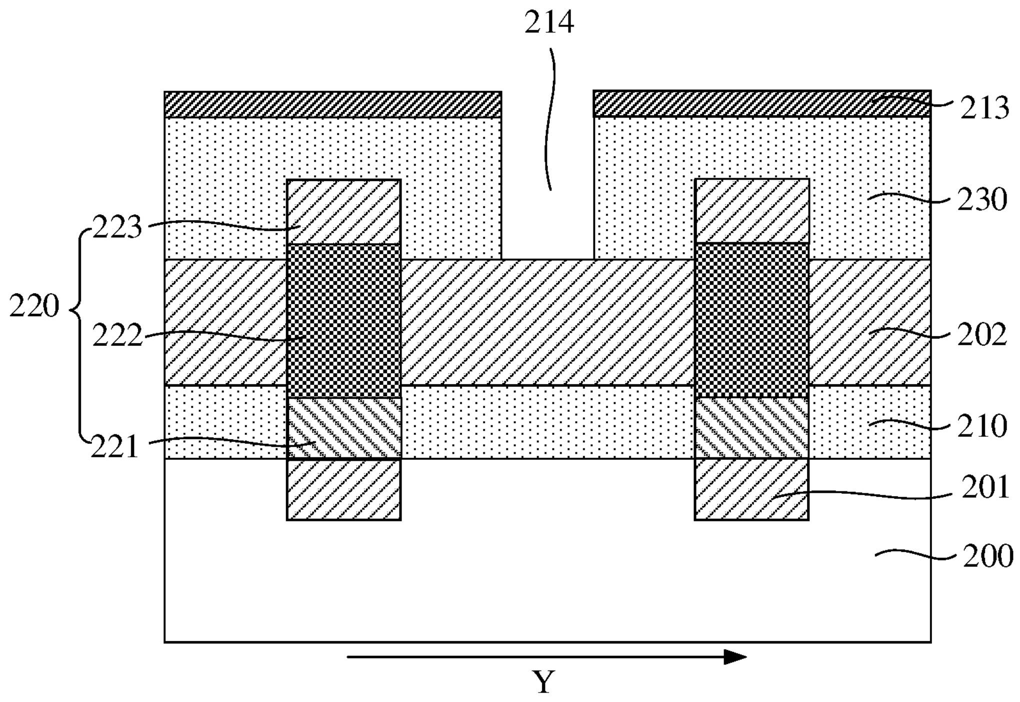
Figure 31:
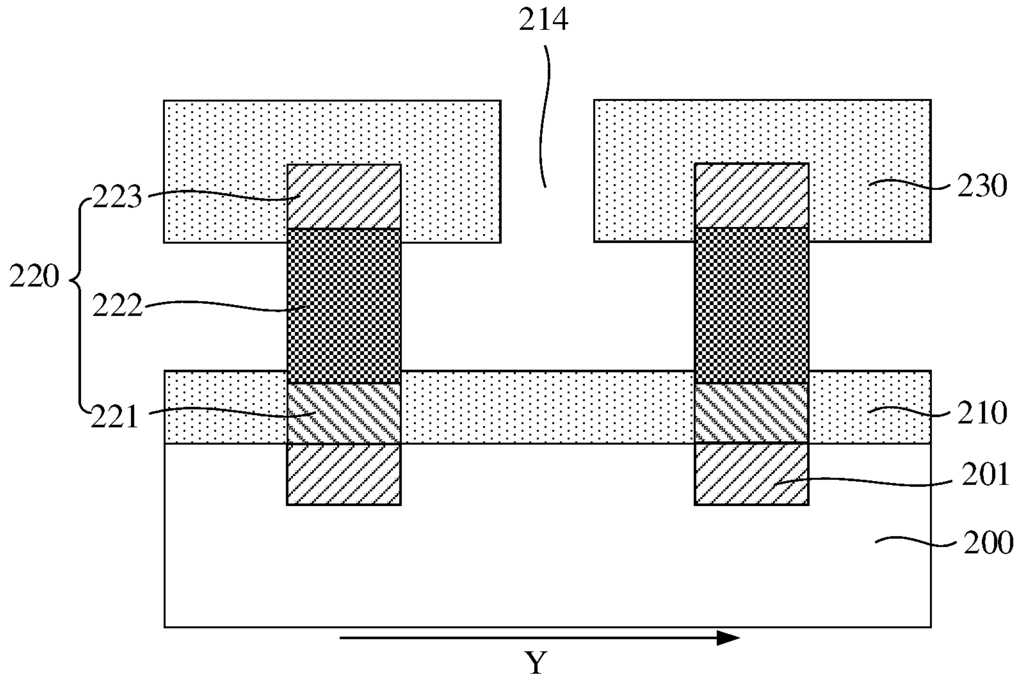
Figure 32:
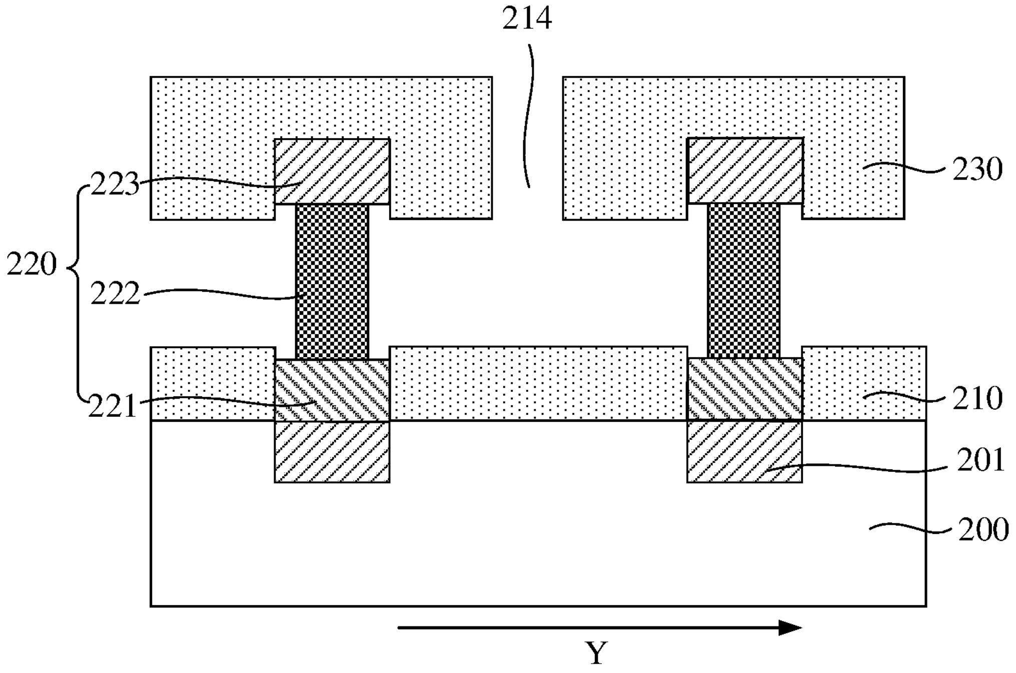
Figure 33:
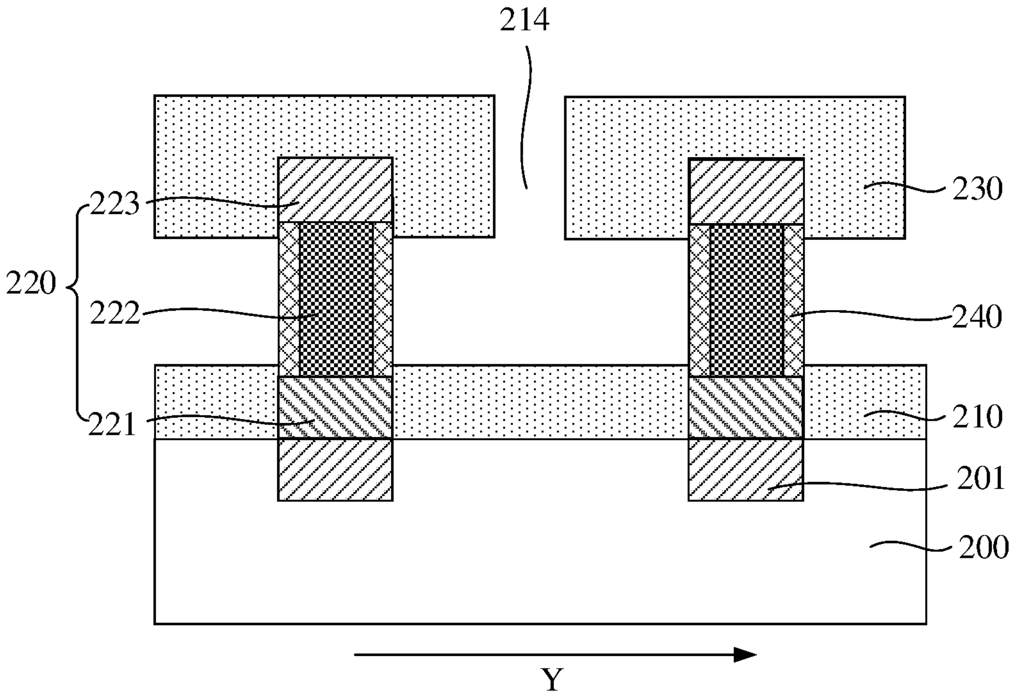
Figure 34:
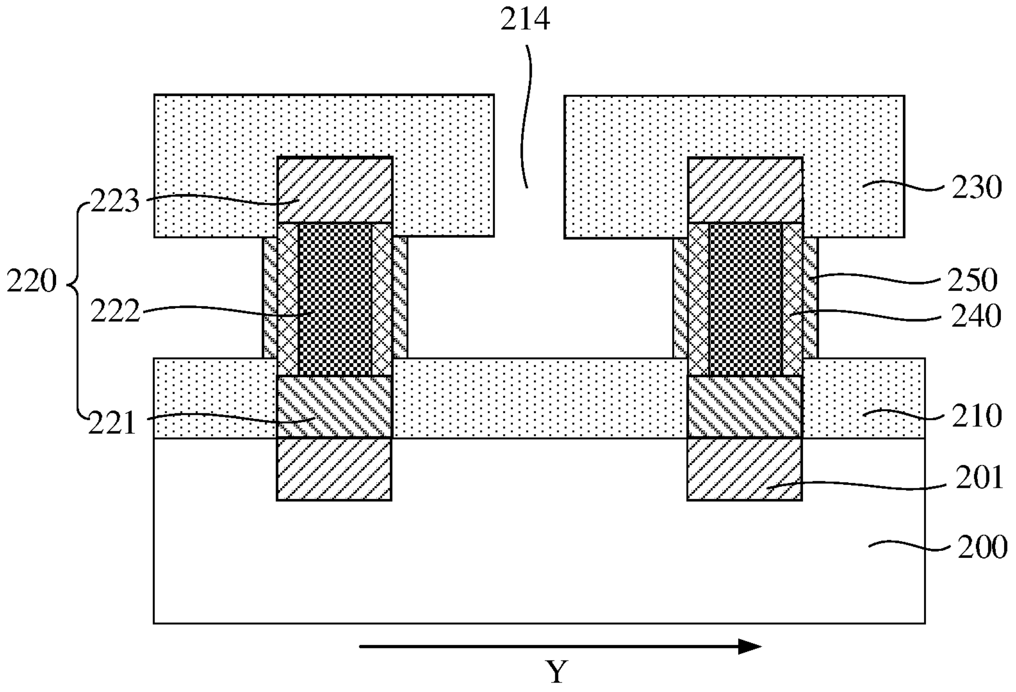
Figure 35:
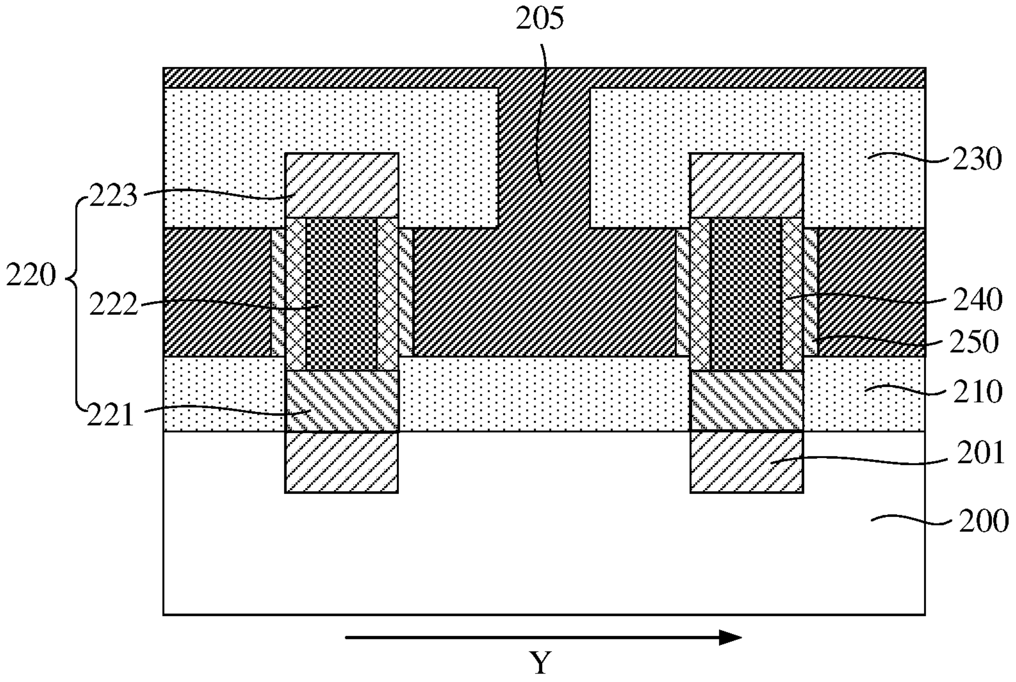
Figure 36:
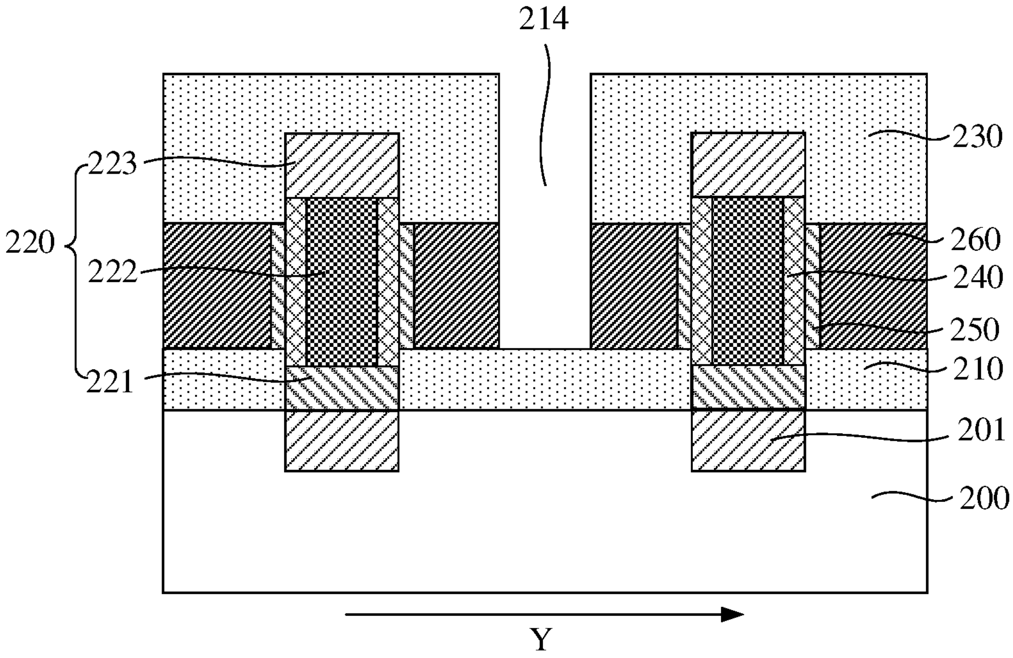

Referring to FIG. 30, the first mask layer 103 is patterned by taking the second mask layer 213 as a mask to form an opening. The fourth isolation film 233 is etched along the opening to form a through hole 214. The remaining part of the fourth isolation film 233 serve as a second isolation layer 230.

The subsequent operations of the method for manufacturing a semiconductor structure are the same as or similar to corresponding operations of the method for manufacturing a semiconductor structure provided in the aforementioned embodiments (referring to FIG. 7 to FIG. 13 and FIG. 20 to FIG. 26) of the disclosure and will not be repeated here.

It can be understood that the method for manufacturing a semiconductor structure illustrated in FIG. 27 to FIG. 37 is different from the method for manufacturing a semiconductor structure illustrated in FIG. 1 to FIG. 26 only in the process flow, i.e., whether the active pillar is formed first or later. That is, the method for manufacturing the semiconductor structure, contents and elements illustrated in FIG. 1 to FIG. 26 are also applicable to the semiconductor structure illustrated in FIG. 27 to FIG. 37.

Some embodiments of the disclosure provide the method for manufacturing a semiconductor structure, which can form the semiconductor structure provided in the following embodiments. The following will be described in detail below with reference to the accompanying drawings.

FIG. 13 and FIG. 26 are schematic cross-sectional diagrams of the structure of a semiconductor structure provided by an embodiment of the disclosure. FIG. 13 is a schematic cross-sectional diagram of the structure along the second direction Y of a semiconductor structure provided by an embodiment of the disclosure, and FIG. 26 is a schematic cross-sectional diagram of the structure along the second direction X of a semiconductor structure provided by an embodiment of the disclosure.

Referring to FIG. 13 or FIG. 26, the semiconductor structure includes: a substrate 100 provided with a bit line 101 extending in a first direction X; an active pillar 120 located on the bit line 101, having a bottom surface in contact with the bit line 101, and doped with an N-type element; an inversion region 140 located on a side surface of the active pillar 120 and doped with a P-type element; and a dielectric layer 150 and a word line 160 extending in a second direction Y that wrap part of the inversion region 140, in which the dielectric layer 150 is located between the word line 160 and the inversion region 140.

In some embodiments, the orthographic projection of the second direction Y and the orthographic projection of the first direction X on the substrate 100 are perpendicular to each other. The material of the substrate 100 may be a semiconductor material. The semiconductor material may specifically be any one of silicon, germanium, silicon germanium or silicon carbide.

In some embodiments, the bit line 101 is a semiconductor bit line, and the semiconductor bit line is doped with the N-type element. The doping element can serve as carriers, which can improve the migration and diffusion of carriers between the bit line 101 and the active pillar 120, thereby being beneficial to improving the conductivity of the bit line 101 and the active pillar 120. Specifically, the N-type element can be doped in-situ. The N-type element may be a group V element such as phosphorus (P), bismuth (Bi), antimony (Sb), arsenic (As). The material of the bit line 101 is the same as that of the initial substrate, and may be any one of silicon, germanium, silicon germanium or silicon carbide. In other embodiments, the N-type element may be implanted into the substrate 100 by an ion implantation process or a diffusion process to form the semiconductor bit line. That is, the bit line 101 and the substrate 100 are integrated, which improves the interface performance between the bit line 101 and the substrate 100, and is beneficial to reducing interface state defects, thereby improving the electrical performances of the semiconductor structure.

In other embodiments, the bit line 101 is a metal bit line, and the semiconductor structure further includes a bit line barrier layer and a bit line dielectric layer. The bit line barrier layer is located between the substrate 100 and the metal bit line, and the bit line dielectric layer is located on the surface, away from the bit line barrier layer, of the metal bit line. The metal has low resistance, which is beneficial to improving the conductivity of the bit line 101 and the active pillar 120, and in turn improving the conductivity of the bit line 101. Specifically, the material of the metal bit line may be tungsten, copper or silver, the material of the bit line barrier layer may be silicon nitride, silicon oxide or silicon carbide, and the material of the bit line dielectric layer may be silicon oxide or silicon nitride.

In some embodiments, the material of the first isolation layer 110 is an insulating material, which may be silicon dioxide, silicon carbide or silicon nitride. The second isolation layer 130 is composed of a second isolation film 131 and a third isolation film 132. The material of the second isolation film 131 may be silicon dioxide, silicon carbide or silicon nitride, and the material of the third isolation film 132 may be the same as that of the second isolation film 131. In other embodiments, the material of the third isolation film 132 may be different from that of the second isolation film 131.

In some embodiments, the active pillar 120 includes the first region 121, the second region 122 and the third region 123 that are distributed from the surface of the substrate 100 to a direction away from the substrate 100 in sequence. The first region 121, the second region 122, and the third region 123 may be regarded as the bulk of the active pillar 120. The bulk of the active pillar 120 may be an intrinsic semiconductor, and the intrinsic semiconductor material may be silicon, germanium, or silicon germanium. It can be understood that the intrinsic semiconductor is an un-doped semiconductor.

In some embodiments, the second region 122 is doped with the N-type element, and the doping element in the second region 122 may be the same as that in the bit line 101. In other embodiments, the doping element in the second region 122 may be different from that in the bit line 101. For example, the bit line 101 is doped with phosphorus, while the second region 122 is doped with arsenic. The first region 121, the second region 122 and the third region 123 are doped with the N-type element.

In some embodiments, the material of the active pillar 120 is the same as that of the bit line 101, so that the lattice mismatch factor between the active pillar 120 and the bit line 101 is 0, which effectively avoids the problems of lattice defects and internal resistance increase in the active pillar 120, and is beneficial to improving the conductivity of the active pillar 120. In other embodiments, the material of the active pillar 120 may be different from that of the bit line 101.

In some embodiments, the inversion region 140 is located at the side surface of the thinned second region 122. The second region 122 is doped with the N-type element, and the inversion region 140 doped with the P-type element. That is, the doping element type of the second region 122 is opposite to that of the inversion region 140. The active pillar 120 can serve as a source or a drain of the semiconductor structure, and the word line 160 wrapping the inversion region 140 can serve as a gate of the semiconductor structure. When a positive voltage is applied to the gate terminal and the drain terminal to form an applied electric-field, an electron-bridge is formed in the active pillar 120, and the P-type element in the inversion region 140 is converted into an electron-hole pair. Electrons can leave the inversion region 140 along the electron-bridge, while holes cannot leave the inversion region 140. That is to say, the inversion region 140 can store holes, i.e. the inversion region 140 has the function of storing charges, and thus can be regarded as an equivalent capacitor, which can simplify the process of manufacturing a capacitor and is beneficial to reducing the line width of the semiconductor structure. Therefore, the size of the capacitor can be larger, so as to ensure that the storage capacity of the capacitor is larger, which is beneficial to improving the storage density of the semiconductor structure. The P-type element may be a group III element such as boron (B), aluminum (Al), gallium (Ga), or indium (In).

In some embodiments, the inversion region 140 has a thickness in a range of 4 nm to 15 nm in the direction perpendicular to the sidewall of the active pillar 120 and toward the axial center of the active pillar 120. The thickness of the inversion region 140 may be specifically 4 nm, 8 nm, 13 nm or 15 nm. The thickness range of the inversion region 140 should ensure that the area for storing the holes in the inversion region 140 is large and thus can accommodate more holes (i.e., the capacity of the capacitor is larger), which ensures that the storage capacity of the capacitor is larger, thereby being beneficial to improving the storage density of the semiconductor structure, and also avoiding the issue that the width of the word line formed subsequently is too small because the width of the inversion region 140 in the horizontal direction of the semiconductor structure is too large.

In some embodiments, in the direction parallel to the side surface of the active pillar 120, the overall height of the inversion region 140 is 8 nm to 30 nm higher than the height of part, wrapped by the dielectric layer 150 and the word line 160, of the inversion region 140. That is, the height of the inversion region 140 located at the side surfaces of the first isolation layer 110 and the third isolation layer 130 is in a range of 8 nm to 30 nm, and may specifically be 8 nm, 10 nm, 20 nm or 30 nm. In this way, it can be ensured that the area for storing holes in the inversion region 140 is large, and thus can accommodate more holes (i.e., the capacity of the capacitor is larger), which ensures that the storage capacity of the capacitor is larger, thereby being beneficial to improving the storage density of the semiconductor structure, and also avoiding the issue that the inversion region 140 occupies an excessive line width in the perpendicular direction of the semiconductor structure. In one specific example, the height of the inversion region 140 located at the side surface of the second region 122 is 20 nm, i.e. the height of the part wrapped by the dielectric layer 150 and the word line 160 of the inversion region 140 is 20 nm, and the total height of the inversion region 140 located at the side surfaces of the first isolation layer 110 and the third isolation layer 130 is 8 nm, so the overall height of the inversion region 140 can be 28 nm.

In some embodiments, in the direction parallel to the side surface of the active pillar 120, the height of the inversion region 140 located on the side surface of the first isolation layer 110 may be equal to the height of the inversion region 140 located on the side surface of the third isolation layer 130, and the side surface of the inversion region 140 is flush with the side surface of the first region 121 and the side surface of the third region 123. In other words, the orthographic projection of the inversion region 140 on the substrate 100 falls in and coincides with the orthographic projection of the first region 121 on the substrate 100, which is beneficial to improving the flatness of the surface of the dielectric layer subsequently formed.

In some embodiments, the inversion region 140 may be partially doped. In addition, in the direction perpendicular to the surface of the substrate 100, the inversion region 140 includes two doped parts and a bulk located between adjacent doped parts. The bulk may be un-doped. The bulk material of the inversion region 140 includes silicon, germanium or silicon germanium.

In some embodiments, when the bulk material of the inversion region 140 and the bulk material of the active pillar 120 are the same, the lattice mismatch factor between the active pillar 120 and the inversion region 140 is 0, which effectively avoids the problems of lattice defects and internal resistance increase in the inversion region 140, and is beneficial to improving the conductivity of the inversion region 140. In other embodiments, the bulk material of the inversion region 140 and the bulk material of the active pillar 120 may be different.

The dielectric layer 150 serves as a gate dielectric layer or a gate oxide layer to suppress a short channel effect, for example to suppress the tunneling leakage current. The material of the dielectric layer 150 may be silicon dioxide, silicon carbide, silicon nitride or other high dielectric constant materials.

In some embodiments, the word line 160 extending along the second direction Y wraps part of the inversion region 140, and the inversion region 140 is located at the side surface of the active pillar 120. That is, the word line 160 also wraps part of the active pillar 120. Therefore, the semiconductor structure is a GAA structure, and realizes the four-sided wrapping of the active pillar 120 by the gate, which can avoid the leakage current, capacitance effect and short-channel effect caused by the reduction of the gate spacing size, reduce the occupied line width of the word line 160 in the vertical direction, and is beneficial to enhancing the gate control performance and improving the integration of the semiconductor structure. The material of the word line 160 may be any one of metal tungsten, copper or aluminum.

In some embodiments, the material of an insulating layer 170 may be silicon dioxide, silicon carbide or silicon nitride. As the materials of the first isolation layer 110, the second isolation layer 130, and the insulating layer 170 are the same, interface defects between the first isolation layer 110 and the insulating layer 170 and between the second isolation layer 130 and the insulating layer 170 can be reduced. In other embodiments, the materials of the first isolation layer 110, the second isolation layer 130 and the insulating layer 170 may be different from each other or both of them are the same.

Correspondingly, another embodiment of the disclosure also provides a semiconductor structure. The semiconductor structure provided by another embodiment of the disclosure is substantially the same as the semiconductor structure provided by the aforementioned embodiments (referring to FIG. 25 and FIG. 26), with the main difference that the second isolation layer in the semiconductor structure provided by the aforementioned embodiments of the disclosure is composed of the second isolation film and the third isolation film, while the second isolation layer in the semiconductor structure provided by another embodiment of the disclosure is integrated. Details of contents or elements identical or similar to those given in the foregoing embodiments will not be repeated, and only descriptions different from those described above will be described in detail. The semiconductor structure provided by another embodiment of the disclosure will be described in detail below with reference to FIG. 37.

Figure 37:
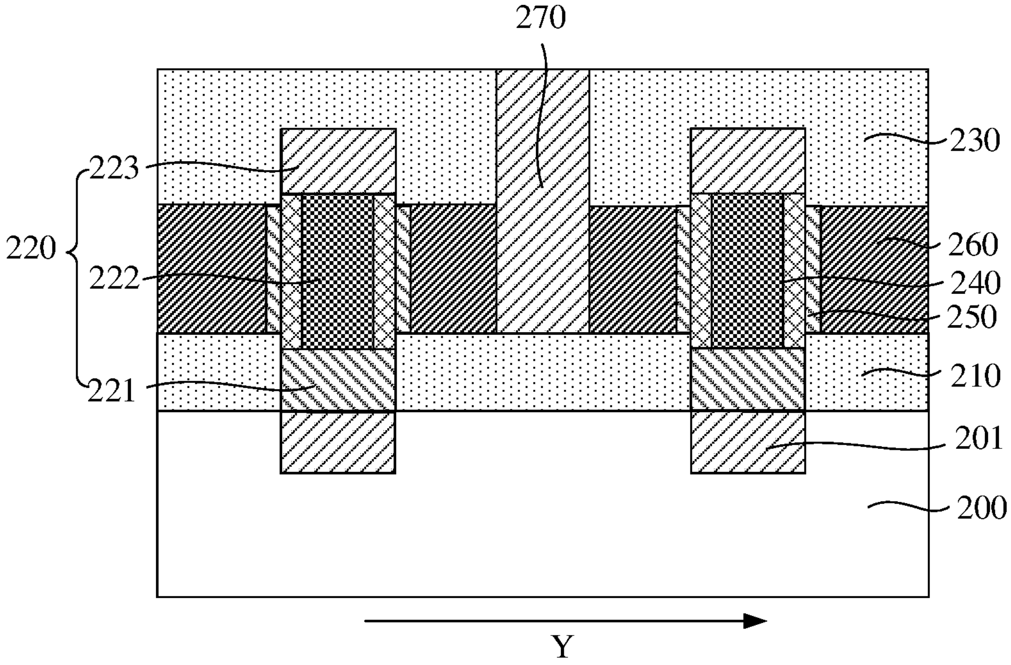

FIG. 37 is a schematic structural diagram of a semiconductor structure provided by another embodiment of the disclosure.

Referring to FIG. 37, the semiconductor structure includes: a substrate 200 provided with a bit line 201 extending along a first direction X in the substrate 200; an active pillar 220 located on the bit line 201, having a bottom surface in contact with the bit line 201, and doped with an N-type element; an inversion region 240 located at the side surface of the active pillar 220 and doped with a P-type element; and a dielectric layer 250 and a word line 260 extending in a second direction Y that wrap part of the inversion region 240, in which the dielectric layer 250 is located between the word line 260 and the inversion region 240.

In some embodiments, the material of the second isolation layer may be any one of silicon dioxide, silicon carbide or silicon nitride, and the material of the second isolation layer 130 may be the same as that of the first isolation layer 110. In other embodiments, the material of the second isolation layer 130 may be different from that of the first isolation layer 110.

Figure 38:
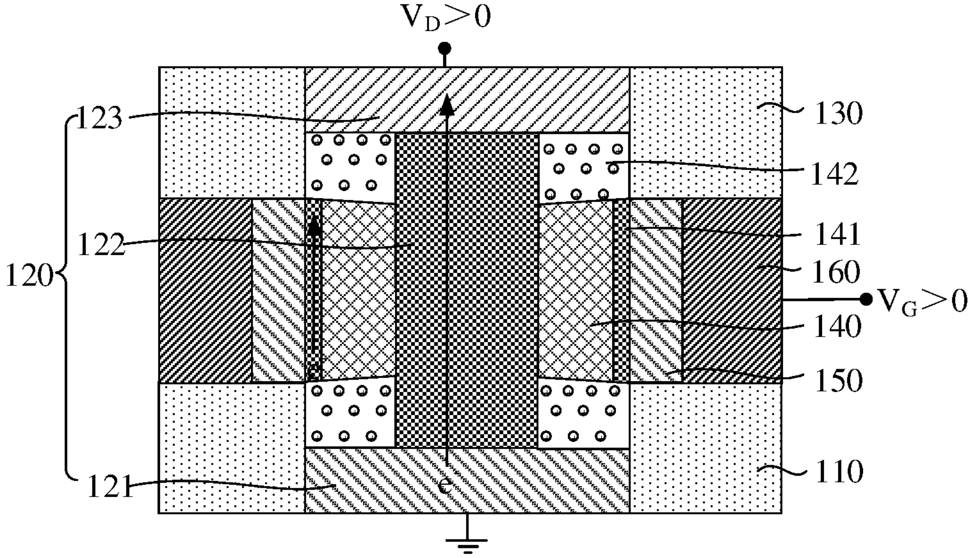
FIG. 38 is a partial schematic cross-sectional diagram of the structure of a semiconductor structure provided by an embodiment of the disclosure when a positive voltage is applied to the gate terminal and the source terminal.

The principle of forming an equivalent capacitor in the semiconductor structure will be illustrated in more detail below with reference to FIGS. 13, 38 and 39. FIG. 38 is a partial schematic cross-sectional diagram of the structure of a semiconductor structure provided by an embodiment of the disclosure when a positive voltage is applied to the gate terminal and the source terminal; and FIG. 39 is a partial schematic cross-sectional diagram of the structure of a semiconductor structure provided by an embodiment of the disclosure when a positive voltage is applied to a gate terminal and a negative voltage is applied to the source terminal.

Figure 39:
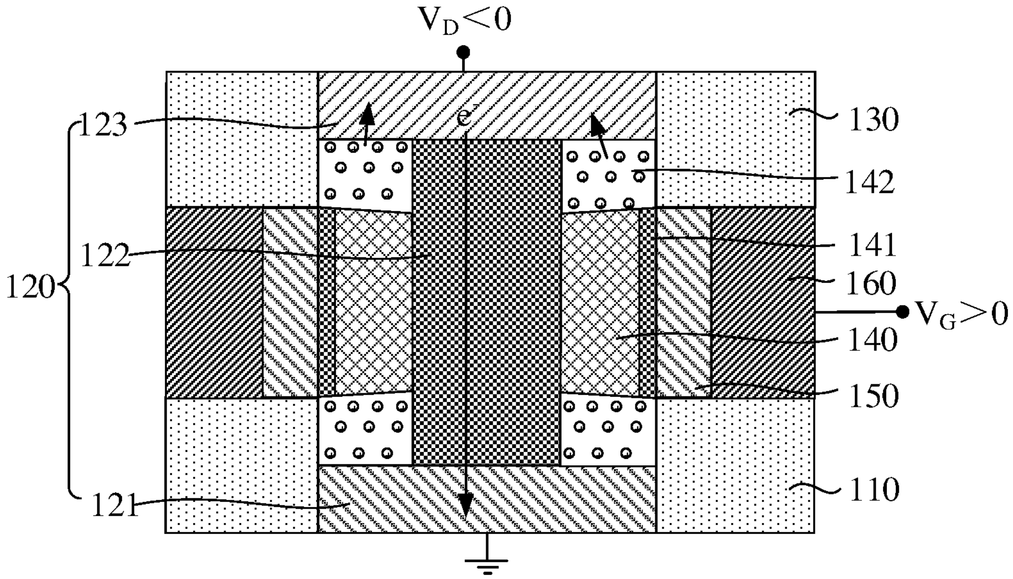
FIG. 39 is a partial schematic cross-sectional diagram of the structure of a semiconductor structure provided by an embodiment of the disclosure when a positive voltage is applied to a gate terminal and a negative voltage is applied to a source terminal.

Referring to FIGS. 25, 38, and 39, the active pillar 120 may serve as a source or a drain of the semiconductor structure, and the word line 160 may serve as a gate of the semiconductor structure. Referring to FIG. 38, when a positive voltage is applied to the gate terminal and the drain terminal to form an applied electric-field, the electron-hole pair is produced in the area of the inversion region 140 due to the action of the electric field and the N-type element in the active pillar 120 migrates to form an electron-bridge. Due to the existence of the electron-bridge, electrons can leave the inversion region 140, while holes cannot leave the inversion region 140. Further, due to the voltage on the gate, there is an inversion layer 141 in the area directly below the gate. The area below the inversion layer 141 and the second isolation layer 130 and the area below the inversion layer and the first isolation layer 110 constitute a hole storage area 142, which fixes the holes under the first isolation layer 110 and the second isolation layer 130 and store them. Referring to FIG. 39, when a positive voltage is applied to the gate terminal and a negative voltage is applied to the drain terminal, all holes are driven out of the hole storage area 142, and migrate and diffuse in the active pillar 120 and the inversion region 140. That is, the inversion region 140 has the function of storing charges, and thus can be regarded as an equivalent capacitor, which can simplify the process flow for manufacturing a capacitor and is beneficial to reducing the line width of the semiconductor structure. Therefore, the size of the capacitor can be larger, so as to ensure that the storage capacity of the capacitor is larger, which is beneficial to improving the storage density of the semiconductor structure.

Those of ordinary skill in the art will appreciate that the above-described embodiments are specific embodiments implementing the disclosure and that various changes in form and detail may be made in practical applications thereto without departing from the spirit and scope of the disclosure. Any person skilled in the art may make their own changes and modifications without departing from the spirit and scope of the disclosure, so the scope of protection of the disclosure shall be subject to the scope defined by the claims.

The invention claimed is:

1. A method for manufacturing a semiconductor structure, comprising:

providing a substrate;

forming a bit line extending along a first direction in the substrate;

sequentially forming a first isolation layer, a sacrificial layer and a second isolation layer that are stacked on the substrate and a top surface of the bit line, wherein the second isolation layer has a through hole penetrating through the second isolation layer along a thickness direction of the second isolation layer, and the sacrificial layer is exposed at a bottom of the through hole;

forming an active pillar on the bit line, wherein a bottom surface of the active pillar is in contact with the bit line and the active pillar is doped with an N-type element;

removing the sacrificial layer to expose the side surface of the active pillar;

thinning part of a sidewall of the active pillar along a thickness direction of the active pillar;

forming an inversion region at a side surface of the active pillar, wherein the inversion region is doped with a P-type element; and sequentially forming a dielectric layer and a word line extending along a second direction to wrap part of the inversion region, wherein the dielectric layer is located between the word line and the inversion region.

2. The method according to claim 1, wherein the thinning is carried out by a wet etching process and an etching liquid used in the wet etching process is an alkaline liquid.

3. The method according to claim 1, wherein a material of the sacrificial layer comprises silicon nitride and the sacrificial layer is removed by using a hot phosphoric acid etching solution.

4. The method according to claim 1, wherein sequentially forming the first isolation layer, the sacrificial layer and the second isolation layer that are stacked on the substrate comprises:

sequentially forming a first isolation film, the sacrificial layer, a second isolation film and a first mask layer with a first opening that are stacked on the substrate and the top surface of the bit line;

with the first mask layer as a mask, sequentially etching the first mask layer, the second isolation film, the sacrificial layer and the first isolation film along the first opening to form a trench, wherein the bit line is exposed at a bottom of the trench, and a remaining part of the first isolation film is used as the first isolation layer;

forming the active pillar, wherein the active pillar fills up the trench;

sequentially forming a third isolation film and a second mask layer on the second isolation film, wherein the third isolation film covers a top surface of the active pillar; and patterning the second mask layer, the third isolation film and the second isolation film to form the through hole, wherein a remaining part of the second isolation film and a remaining part of the third isolation film are together used as the second isolation layer.

5. The method according to claim 1, wherein sequentially forming the first isolation layer, the sacrificial layer and the second isolation layer on the substrate comprises:

forming the active pillar on the substrate;

sequentially forming the first isolation layer, the sacrificial layer and a fourth isolation film that are stacked on the substrate, wherein the sacrificial layer is also located on part of the side surface of the active pillar, and the fourth isolation film is located on part of the side surface and a top surface of the active pillar; and patterning the fourth isolation film to form the through hole, wherein a remaining part of the fourth isolation film is used as the second isolation layer.

6. The method according to claim 1, wherein the bit line is formed by using an epitaxy growth process, and forming the bit line comprises:

providing an initial substrate having a channel extending along the first direction; and forming the bit line that fills up the channel.

7. The method according to claim 1, wherein the inversion region is formed by a selective epitaxy growth process.

8. The method according to claim 7, wherein the P-type element is doped in-situ during the formation of the inversion region.

9. The method according to claim 1, wherein forming the word line comprises:

forming a conducting film that fills up the through hole, wherein the conducting film is also located between the first isolation layer and the second isolation layer, and surrounds the inversion region; and patterning the conducting film to form a plurality of mutually discrete word lines.

10. The method according to claim 9, wherein patterning the conducting film comprises:

removing the conducting film located in and directly below the through hole, wherein a remaining part of the conducting film is used as the word lines.

11. The method according to claim 10, further comprising, forming an insulating layer that fills up the through hole after forming the word lines, wherein the insulating layer also fills up a region between adjacent word lines.

12. A semiconductor structure, comprising:

a substrate that has a bit line extending along a first direction;

an active pillar located on the bit line, wherein a bottom surface of the active pillar is in contact with the bit line, and the active pillar is doped with an N-type element;

an inversion region located on a side surface of the active pillar, and doped with a P-type element; and a dielectric layer and a word line that extends along a second direction, wherein the dielectric layer and the word line wrap part of the inversion region, and the dielectric layer is located between the word line and the inversion region;

wherein an overall height of the inversion region is 8 nm to 30 nm higher than a height of part, wrapped by the dielectric layer and the word line, of the inversion region in a direction parallel to a sidewall of the active pillar.

13. The semiconductor structure according to claim 12, wherein the bit line is a semiconductor bit line, and the semiconductor bit line is doped with an N-type element.

14. The semiconductor structure according to claim 12, wherein a bulk material of the inversion region comprises silicon, germanium, or silicon germanium.

15. The semiconductor structure according to claim 12, wherein the inversion region has a thickness of in a range of 4 nm to 15 nm in a direction perpendicular to a sidewall of the active pillar and toward an axial central of the active pillar.

16. The semiconductor structure according to claim 12, wherein a bulk material of the inversion region is the same as a bulk material of the active pillar.

17. The semiconductor structure according to claim 16, wherein the bulk material of the inversion region comprises silicon, germanium, or silicon germanium.

* * * * *